US011171288B2

(12) United States Patent
Jang et al.

(10) Patent No.: US 11,171,288 B2
(45) Date of Patent: Nov. 9, 2021

(54) MASK ASSEMBLY, DEPOSITION APPARATUS HAVING THE SAME, AND METHOD OF FABRICATING DISPLAY DEVICE USING THE SAME

(71) Applicant: Samsung Display Co., Ltd., Yongin-Si (KR)

(72) Inventors: Wonyoung Jang, Hwaseong-si (KR); Minseok Kim, Suwon-si (KR); Jongbum Kim, Yongin-si (KR); Jongdae Lee, Pocheon-si (KR)

(73) Assignee: Samsung Display Co., Ltd.

( * ) Notice: Subject to any disclaimer, the term of this patent is extended or adjusted under 35 U.S.C. 154(b) by 168 days.

(21) Appl. No.: 16/425,701

(22) Filed: May 29, 2019

(65) Prior Publication Data
US 2019/0386221 A1    Dec. 19, 2019

(30) Foreign Application Priority Data

Jun. 15, 2018 (KR) .......................... 10-2018-0068779

(51) Int. Cl.
*B05D 1/32* (2006.01)
*H01L 51/00* (2006.01)
*C23C 14/04* (2006.01)
*H01L 51/56* (2006.01)
(Continued)

(52) U.S. Cl.
CPC ............ *H01L 51/0011* (2013.01); *B05D 1/32* (2013.01); *C23C 14/042* (2013.01); *H01L 51/56* (2013.01); *H01L 27/3244* (2013.01); *H01L 51/5012* (2013.01); *H01L 2227/323* (2013.01)

(58) Field of Classification Search
CPC .............................. H01L 51/0011; B05D 1/32
See application file for complete search history.

(56) References Cited

U.S. PATENT DOCUMENTS

| 7,572,338 B2 * | 8/2009 | Kim ...................... C23C 14/042 |
| | | 118/720 |
| 9,847,484 B2 * | 12/2017 | Kim .................... H01L 51/0011 |
| 10,141,511 B2 * | 11/2018 | Kim .................... H01L 51/0011 |

(Continued)

FOREIGN PATENT DOCUMENTS

| EP | 3282035 A2 | 2/2018 |
| KR | 10-2017-0141854 A | 12/2017 |

OTHER PUBLICATIONS

Extended European Search Report, Application No. 19175009.0, dated Dec. 16, 2019, 8 pages.

*Primary Examiner* — Caleb E Henry
(74) *Attorney, Agent, or Firm* — Innovation Counsel LLP

(57) ABSTRACT

A mask assembly may include a frame, first sticks, and masks. The first sticks may extend in a first direction and may be arranged in a second direction. The plurality of masks may be disposed on the frame and the first sticks. The plurality of masks may extend in the second direction and may be arranged in the first direction. Each of the first sticks may have a first edge and a second edge, which are opposite to each other in the second direction. When viewed in a plan view defined by the first and second directions, the first and second edges of an outermost stick of the first sticks may have different shapes, and linear lengths of the first and second edges of the outermost stick may be substantially equal to each other, where the linear lengths are lengths of the first and second edges in a straight state.

6 Claims, 22 Drawing Sheets

(51) Int. Cl.
    *H01L 27/32*     (2006.01)
    *H01L 51/50*     (2006.01)

(56) References Cited

U.S. PATENT DOCUMENTS

| | | | |
|---|---|---|---|
| 10,196,732 B2* | 2/2019 | Kwon | H01L 51/00 |
| 10,665,785 B2* | 5/2020 | Kim | H01L 51/0011 |
| 10,787,730 B2* | 9/2020 | Lin | B05C 21/005 |
| 2001/0019807 A1* | 9/2001 | Yamada | H01L 51/0011 |
| | | | 430/139 |
| 2006/0103289 A1* | 5/2006 | Kim | B05B 12/20 |
| | | | 313/402 |
| 2011/0168087 A1* | 7/2011 | Lee | C23C 14/12 |
| | | | 118/504 |
| 2011/0229633 A1* | 9/2011 | Hong | H01L 51/0011 |
| | | | 427/162 |
| 2012/0266813 A1* | 10/2012 | Hong | B05C 21/005 |
| | | | 118/505 |
| 2014/0150721 A1* | 6/2014 | Oh | H01L 51/0011 |
| | | | 118/504 |
| 2014/0239049 A1* | 8/2014 | Kang | B23K 11/10 |
| | | | 228/101 |
| 2014/0315343 A1* | 10/2014 | Kim | C23C 14/50 |
| | | | 438/46 |
| 2016/0144393 A1* | 5/2016 | Kwon | H01L 51/00 |
| | | | 118/504 |
| 2016/0343945 A1* | 11/2016 | Kim | C23C 14/042 |
| 2017/0207390 A1 | 7/2017 | Kim et al. | |
| 2017/0365822 A1 | 12/2017 | Kim | |
| 2018/0040857 A1 | 2/2018 | Hong et al. | |
| 2018/0155818 A1 | 6/2018 | Mu et al. | |

\* cited by examiner

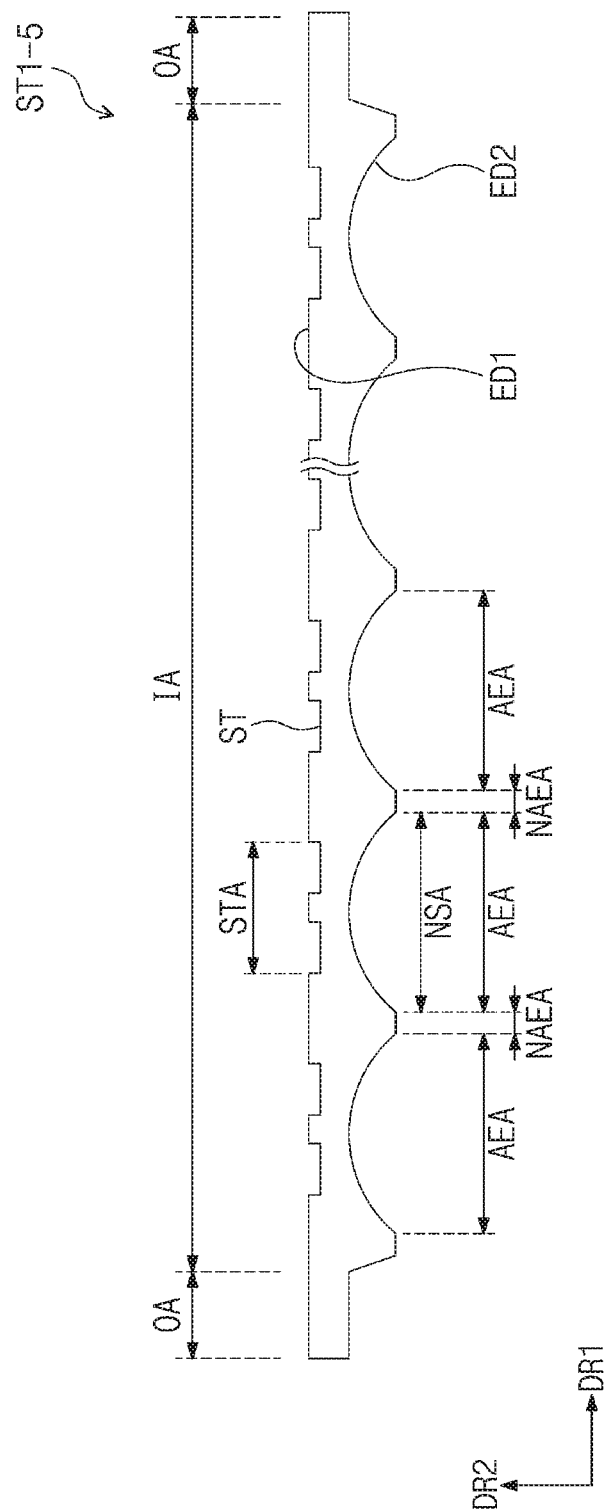

MASK ASSEMBLY, DEPOSITION APPARATUS HAVING THE SAME, AND METHOD OF FABRICATING DISPLAY DEVICE USING THE SAME

CROSS-REFERENCE TO RELATED APPLICATIONS

This U.S. non-provisional patent application claims priority under 35 U.S.C. § 119 to Korean Patent Application No. 10-2018-0068779, filed on Jun. 15, 2018, in the Korean Intellectual Property Office, the entire contents of which are hereby incorporated by reference.

BACKGROUND

The present disclosure relates to a display device, and in particular, to a mask assembly, a deposition apparatus having the mask assembly, and a method of fabricating a display device using the deposition apparatus.

In general, a light-emitting display device includes a plurality of pixels, each of which has a luminescent device. The luminescent device includes two electrodes and a light emitting layer interposed therebetween. The light emitting layers in the pixels may be classified into a plurality of groups.

A mask assembly is used to deposit the groups of the light emitting layers on a working substrate. The mask assembly includes a frame, a support stick, and a mask. The working substrate is placed on the mask, and then, a luminescent material is deposited on the working substrate to form the patterned structure of the light emitting layers.

SUMMARY

An embodiment of the inventive concept provides a mask assembly having an excellent thermal stability property and an improved deformation-resistance property.

An embodiment of the inventive concept provides a deposition apparatus including the mask assembly.

An embodiment of the inventive concept provides a method of fabricating a highly-reliable display device.

According to an embodiment of the inventive concept, a mask assembly may include a frame, first sticks, and masks. The frame may have a rectangular shape, and a first length in a first direction may be longer a second length in a second direction. A first opening may be defined in the frame. The first sticks may be coupled to the frame to overlap the first opening. The first sticks may extend in the first direction and may be arranged in the second direction. The plurality of masks may be disposed on the frame and the first sticks. The plurality of masks may extend in the second direction and may be arranged in the first direction. Each of the first sticks may have a first edge and a second edge, which are opposite to each other in the second direction. When viewed in a plan view defined by the first and second directions, the first and second edges of an outermost stick of the first sticks may have different shapes, and linear lengths of the first and second edges of the outermost stick may be substantially equal to each other, where the linear lengths are lengths of the first and second edges measured in a straight state.

In an embodiment, one of the first and second edges may include a non-straight region.

In an embodiment, one of the first and second edges of the outermost stick may include a plurality of slit regions.

In an embodiment, a length from a center line of the outermost stick in the second direction to a corresponding edge in a corresponding slit region of the plurality of slit regions may be shorter than a length from the center line of the outermost stick in the second direction to the corresponding edge in an outer region of the outermost stick overlapping the frame.

In an embodiment, the frame may include first and second extension portions, which are opposite to each other in the first direction, and third and fourth extension portions, which are opposite to each other in the second direction, and each of which connects the first extension portion to the second extension portion.

In an embodiment, the outermost stick is one of first and second outermost sticks, which are opposite to each other in the second direction and are placed adjacent to the third and fourth extension portions, respectively.

In an embodiment, the first outermost stick and the second outermost stick may have shapes that are asymmetrical with respect to a direction axis indicating the first direction.

In an embodiment, the outermost stick is one of a first outermost stick and a second outermost stick, which are opposite to each other in the second direction and are placed adjacent to the third extension portion and the fourth extension portion, respectively.

In an embodiment, the plurality of first sticks may include inner sticks disposed between the first outermost stick and the second outermost stick.

In an embodiment, when viewed in the plan view, the first and second edges of each of the inner sticks may have shapes that are symmetric with respect to a direction axis indicating the first direction.

In an embodiment, each of the first extension portion and the second extension portion may have coupling grooves defined therein, and the outermost stick is combined in the coupling grooves.

In an embodiment, when viewed in the plan view, the first sticks may have substantially a same shape.

In an embodiment, each of the plurality of masks may include an opening region, in which the plurality of second openings are defined, and a non-opening region, which encloses the opening region. A portion of each of the first and second edges of the outermost stick may be defined as an active edge region. The active edge region overlaps the opening region. The active edge region of the first edge of the outermost stick may include a curved region. The active edge region of the second edge of the outermost stick may include a slit region. A length from a center line of the outermost stick in the second direction to the second edge in the slit region may be shorter than a length from the center line of the outermost stick in the second direction to the corresponding edge in an outer region of the outermost stick overlapping the frame.

In an embodiment, each of the plurality of masks may include an opening region, in which the plurality of second openings are defined, and a non-opening region, which encloses the opening region. A portion of the first edge of each of the plurality of first sticks may be defined as an active edge region, the active edge region may overlap the opening region, and the active edge region may include a curved region.

In an embodiment, a portion of the second edge of each of the plurality of first sticks may be defined as an inactive edge region. The inactive edge region may overlap the non-opening region. When viewed in the plan view, the inactive edge region may include a plurality of slit regions. A length from a center line of each of the plurality of first sticks in the second direction to the inactive edge region of the second edge may be shorter than a length from the center line of each of the plurality of first sticks in the second direction to a corresponding edge in an outer region of each of the plurality of first sticks overlapping the frame.

In an embodiment, the mask assembly may further include a plurality of second sticks, which are coupled to the frame to overlap the first opening. The plurality of second sticks may extend in the second direction and may be arranged in the first direction.

In an embodiment, each of the plurality of second sticks may overlap a border between two adjacent ones of the plurality of masks.

In an embodiment, some of the plurality of second openings may overlap the first sticks.

According to an embodiment of the inventive concept, a deposition apparatus may include a chamber, a deposition source disposed in the chamber, and a mask assembly disposed in the chamber and on the deposition source to support a working substrate. Here, the mask assembly may have the afore-described features.

According to an embodiment of the inventive concept, a method of fabricating a display device may include placing a working substrate, which is supported by a first mask assembly, in a chamber, and depositing a first deposition material from a first deposition source onto the working substrate. The first mask assembly may have the afore-described features.

In an embodiment, the method may further include dividing the working substrate into a plurality of unit cell regions.

In an embodiment, the first deposition material may be formed on a display region to serve as a first light emitting layer of an organic light emitting diode.

In an embodiment, the method may further include, separating the working substrate from the first mask assembly, mounting the working substrate on a second mask assembly, and depositing a second deposition material, which is supplied from a second deposition source and is different from the first deposition material, onto the working substrate.

In an embodiment, the second mask assembly may include a plurality of second masks, in which openings may be arranged in a different manner from the second openings of the first masks of the first mask assembly.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 5B and 5C are plan views each illustrating outermost sticks according to an embodiment of the inventive concept.

Figure 1:
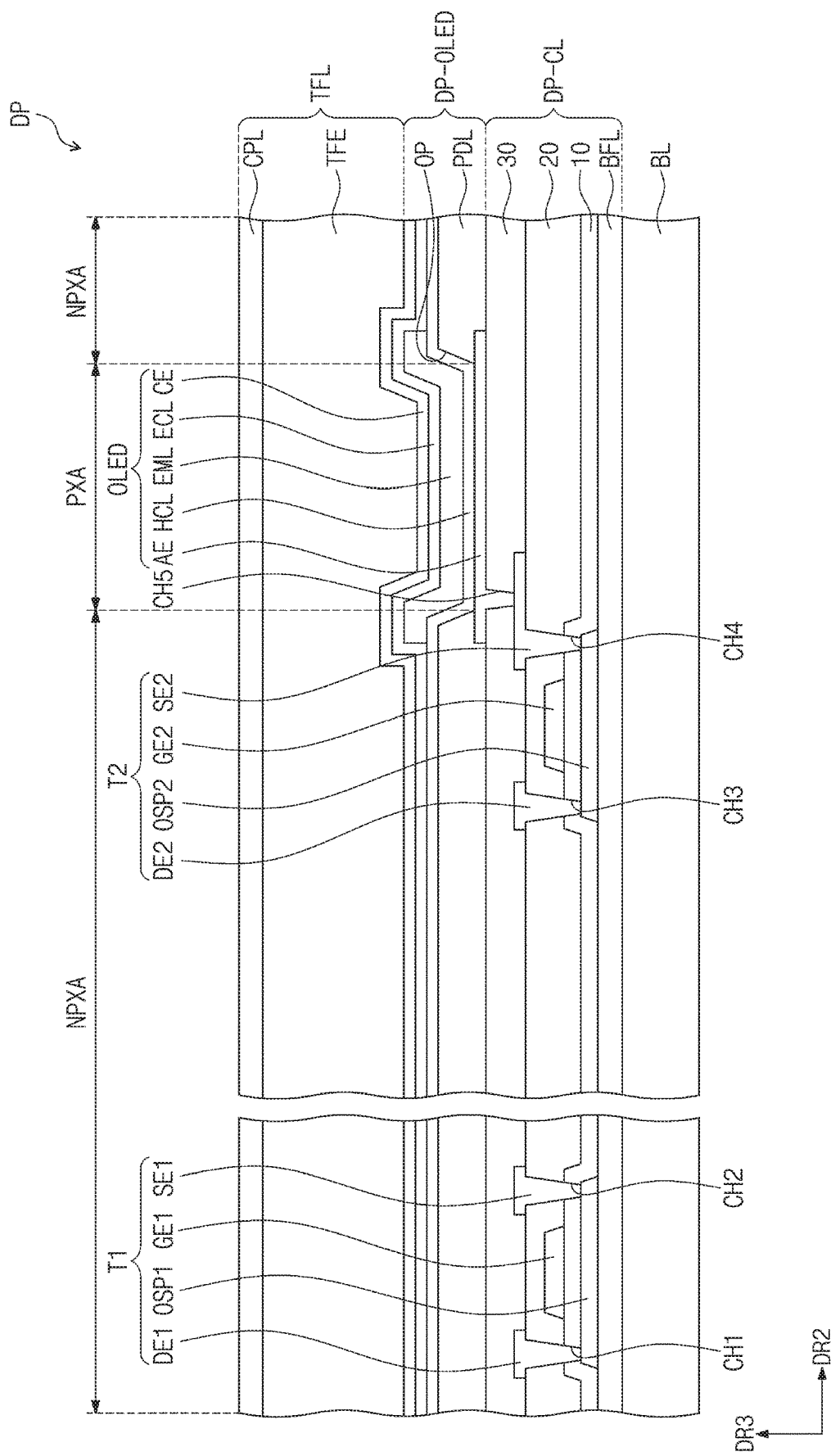
FIG. 1 is a sectional view illustrating a portion of a display panel according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a display panel DP according to an embodiment of the inventive concept. In the present embodiment, the display panel DP may be a light-emitting display panel. FIG. 1 illustrates a vertical section of one of a plurality of pixels. In detail, FIG. 1 illustrates a vertical section of a portion of a pixel, in which a switching transistor T1, a driving transistor T2, and a display element OLED are disposed.

As shown in FIG. 1, the display panel DP may include a base layer BL, a circuit device layer DP-CL on the base layer BL, a display device layer DP-OLED on the circuit device layer DP-CL, and an insulating layer TFL (hereinafter, an upper insulating layer TFL) on the display device layer DP-OLED.

The base layer BL may include a synthetic resin layer. The synthetic resin layer may be formed on a supporting substrate, which is used in a process of fabricating the display panel DP. Thereafter, a conductive layer, an insulating layer, and so forth may be formed on the synthetic resin layer. In the case where the supporting substrate is removed, the synthetic resin layer may serve as the base layer BL.

The circuit device layer DP-CL may include at least one insulating layer and at least one circuit device. The circuit device may include signal lines, pixel-driving circuits, and so forth. The formation of the circuit device layer DP-CL may include forming an insulating layer, a semiconductor layer, and a conductive layer using a coating or deposition process and patterning the insulating layer, the semiconductor layer, and the conductive layer using a photolithography and etching process.

In the present embodiment, the circuit device layer DP-CL may include a buffer layer BFL, a first intermediate inorganic layer 10, and a second intermediate inorganic layer 20, which are formed of inorganic materials, and an intermediate organic layer 30, which is formed of an organic material. FIG. 1 illustrates an example of relative positions of some elements, e.g., a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, constituting the switching and driving transistors T1 and T2. First, second, third, and fourth penetration holes CH1, CH2, CH3, and CH4 may also be exemplarily illustrated in FIG. 1.

The display device layer DP-OLED may include a luminescent device. The display device layer DP-OLED may include organic light emitting diodes, which are used as the luminescent device. The display device layer DP-OLED may include a pixel definition layer PDL. For example, the pixel definition layer PDL may be an organic layer.

A first electrode AE may be disposed on the intermediate organic layer 30. The first electrode AE may be connected to the second output electrode SE2 through a fifth penetration hole CH5 penetrating the intermediate organic layer 30. An opening OP may be defined in the pixel definition layer PDL. The opening OP of the pixel definition layer PDL may be formed to extend to and expose at least a portion of the first electrode AE. Hereinafter, the opening OP of the pixel definition layer PDL will be referred to as a light-emitting opening OP, for a clear distinction from other openings.

Although not shown, a spacer may be disposed on a top surface of the pixel definition layer PDL to overlap a portion of the pixel definition layer PDL. The spacer may be a single object, which is continuously connected to the pixel definition layer PDL, or may be an insulating structure, which is formed by an additional process.

As shown in FIG. 1, the display panel DP may include a light-emitting region PXA and a non-light-emitting region NPXA which is placed adjacent to the light-emitting region PXA. The non-light-emitting region NPXA may be provided to enclose the light-emitting region PXA. In the present embodiment, the light-emitting region PXA may be defined to correspond to a portion of the first electrode AE exposed by the light-emitting opening OP.

A hole control layer HCL may be disposed in both of the light-emitting region PXA and the non-light-emitting region NPXA. The hole control layer HCL may include a hole transport layer and, in an embodiment, the hole control layer HCL may further include a hole injection layer. A light emitting layer EML may be disposed on the hole control layer HCL. The light emitting layer EML may be provided on a region corresponding to the light-emitting opening OP. In other words, the light emitting layer EML may include a plurality of isolated patterns, each of which is provided for a corresponding one of the pixels. The light emitting layer EML may be formed of or include at least one of organic or inorganic materials. The light emitting layer EML may generate a specific color light.

An electron control layer ECL may be disposed on the light emitting layer EML. The electron control layer ECL may include an electron transport layer, and in an embodiment, the electron control layer ECL may further include an electron injection layer. The hole control layer HCL and the electron control layer ECL may be formed using an open mask, and thus, the hole control layer HCL and the electron control layer ECL may be formed in common on a plurality of pixels. A second electrode CE may be disposed on the electron control layer ECL. The second electrode CE may be disposed in common on the plurality of pixels.

The upper insulating layer TFL may be disposed on the second electrode CE. The upper insulating layer TFL may include a plurality of thin films. For example, as shown in FIG. 1, the upper insulating layer TFL may include a thin encapsulation layer TFE and a capping layer CPL, which are different from each other in terms of their functions.

Figure 2:
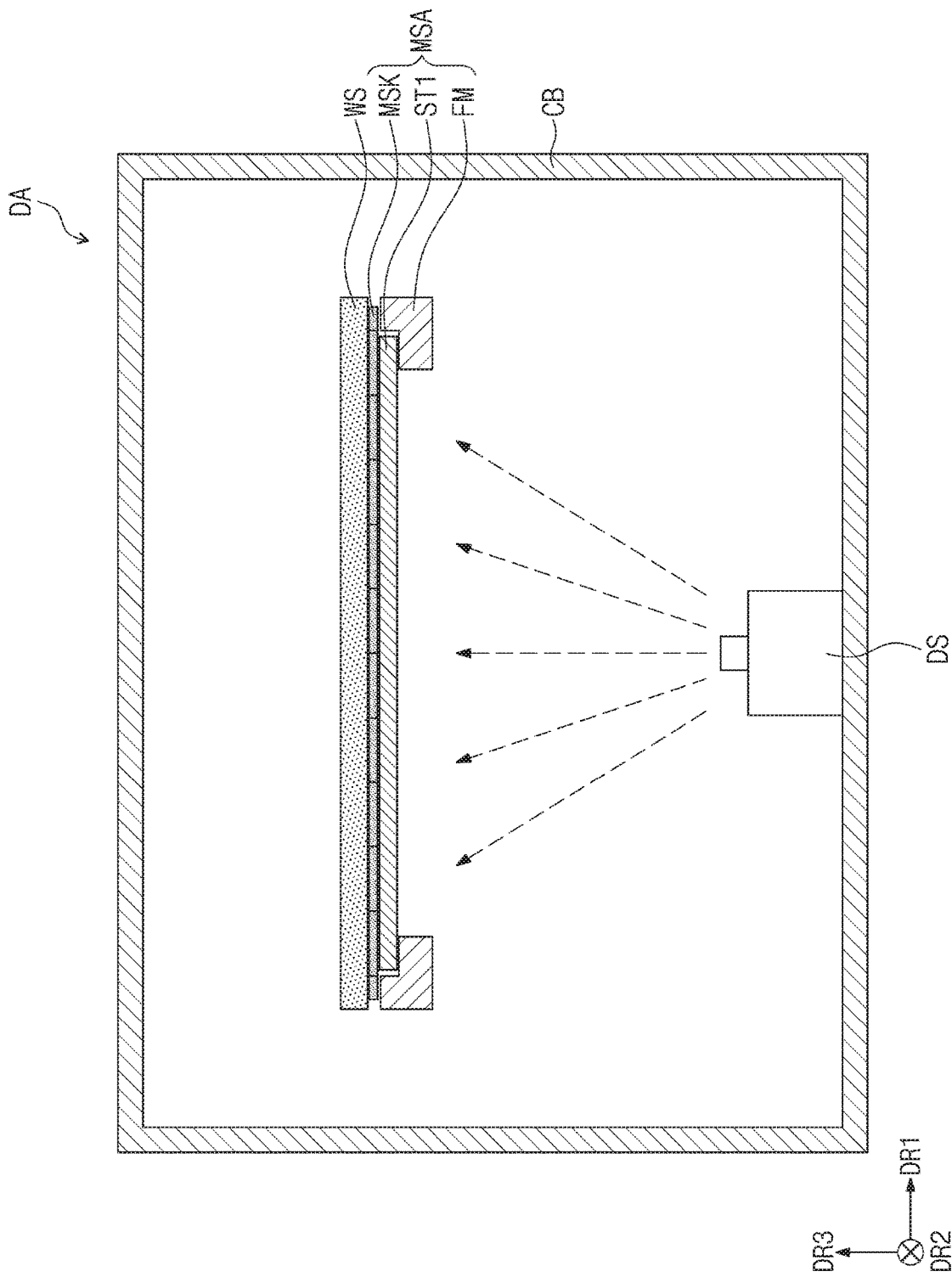
FIG. 2 is a sectional view illustrating a deposition apparatus according to an embodiment of the inventive concept.
Figure 3:
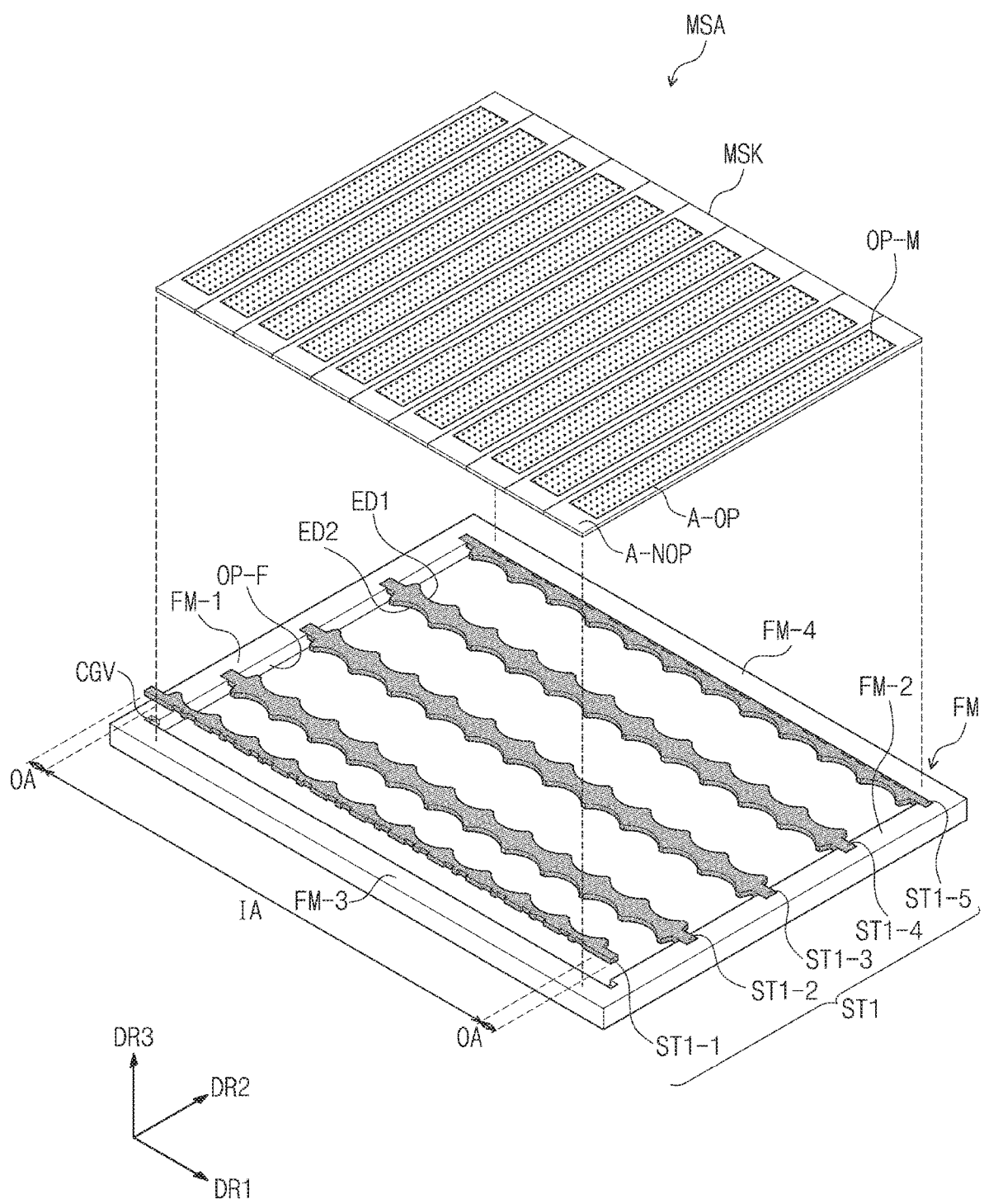
FIG. 3 is a perspective view illustrating a mask assembly according to an embodiment of the inventive concept.
Figure 4:
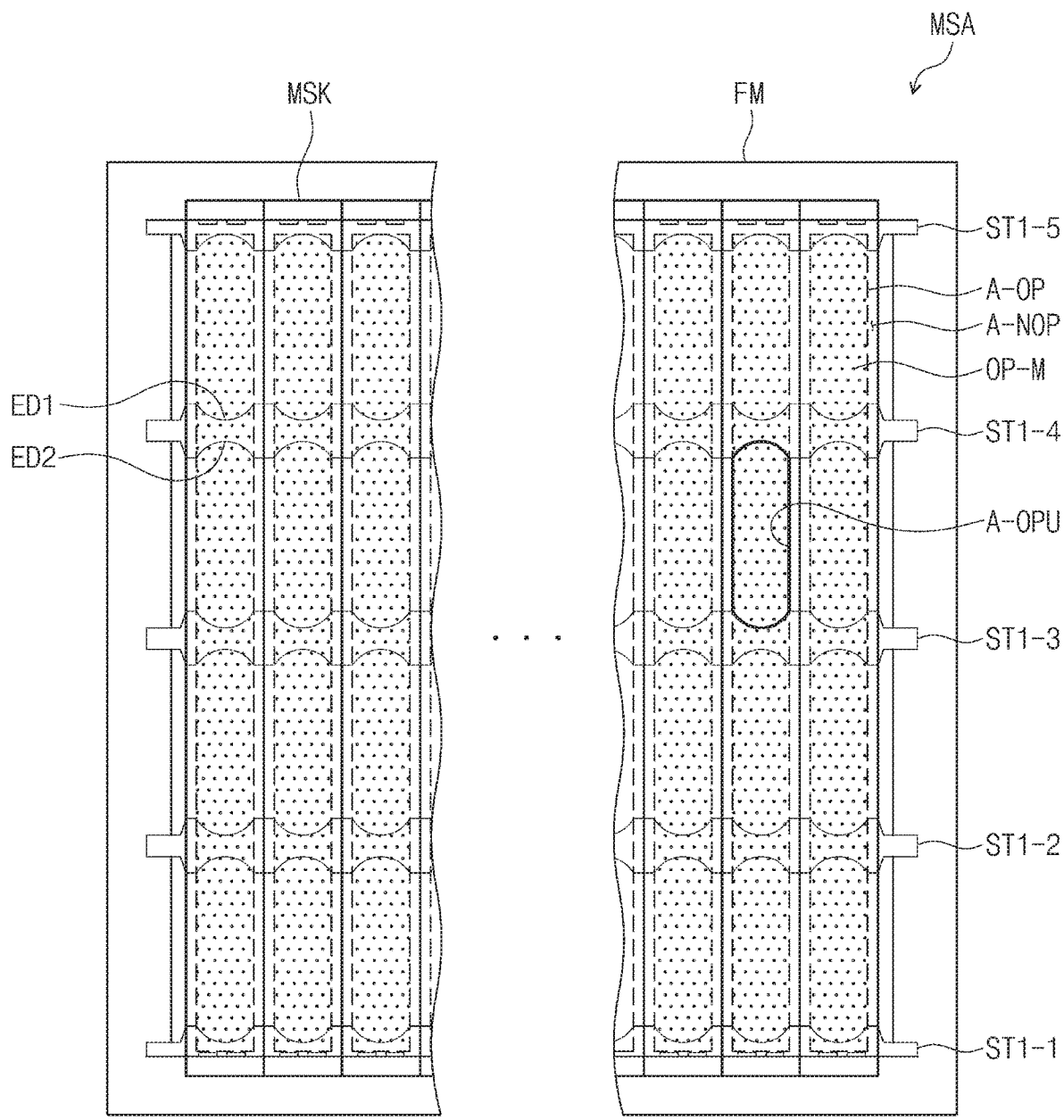
FIG. 4 is a plan view illustrating a mask assembly according to an embodiment of the inventive concept.

FIG. 2 is a sectional view illustrating a deposition apparatus DA according to an embodiment of the inventive concept. FIG. 3 is a perspective view illustrating a mask assembly MSA according to an embodiment of the inventive concept. FIG. 4 is a plan view illustrating the mask assembly MSA according to an embodiment of the inventive concept. In the present embodiment, the deposition apparatus DA may be used to fabricate the display panel DP of FIG. 1, in particular, for a deposition process of the light emitting layer EML.

As shown in FIG. 2, the deposition apparatus DA may include a deposition chamber CB, a deposition source DS disposed in the deposition chamber CB, and the mask assembly MSA disposed in the deposition chamber CB. The mask assembly MSA may support a working substrate WS. A bottom surface of the deposition chamber CB may be parallel to a surface that is defined by a first direction axis DR1 and a second direction axis DR2. A direction normal to the bottom surface of the deposition chamber CB will be referred to as a third direction axis DR3.

Hereinafter, first, second, and third directions may be directions indicated by the first, second, and third direction axes DR1, DR2, and DR3, respectively, and will be identified with the same reference numbers. With regard to an expression of "plan view" to be mentioned in the present specification, a plane for such a plan view may be selected to be parallel to both of the first and second direction axes DR1 and DR2.

In the deposition chamber CB, a deposition process under a condition of vacuum may be performed. The deposition source DS may evaporate a deposition material (e.g., a luminescent material) and emit a vaporized deposition material. The vaporized deposition material may be deposited on the working substrate WS through the mask assembly MSA to form a specific thin-film pattern on the working substrate WS.

Although not shown in FIG. 2, the deposition apparatus DA may further include a jig or a robot arm, which is used to hold the mask assembly MSA. In addition, the deposition apparatus DA may further include an additional mechanical apparatus, which is used to realize an in-line system.

As shown in FIGS. 2, 3 and 4, the mask assembly MSA may include a frame FM, a plurality of first sticks ST1, and a plurality of masks MSK. In an embodiment, the mask assembly MSA may further include at least one stick that is of a kind different from that of the first sticks ST1.

The frame FM may be disposed to have an opening OP-F (hereinafter, a first opening OP-F) that is defined in an inner region thereof. The frame FM may have a rectangular shape, when viewed in a plan view. The frame FM may have a first length in the first direction DR1 and a second length in the second direction DR2, which is not parallel to the first length. In the present embodiment, the first length may be longer than the second length.

The frame FM may be formed of or include at least one of metallic materials. The frame FM may include, for example, an invar alloy having a small thermal expansion coefficient. The frame FM may be formed of or include at least one of, for example, nickel (Ni), nickel-cobalt alloys, or nickel-iron alloys. The frame FM may include four portions. The frame FM may include a first extension portion FM-1 and a second extension portion FM-2 facing each other in the first direction DR1. The frame FM may include a third extension portion FM-3 and a fourth extension portion FM-4, which face each other in the second direction DR2 and each of which is disposed to connect the first extension portion FM-1 to the second extension portion FM-2. The first to fourth extension portions FM-1 to FM-4 may be connected to each other by a welding process or may constitute a single object.

A plurality of coupling grooves CGV may be defined in the frame FM. For example, the coupling grooves CGV may be defined in each of the first and second extension portions FM-1 and FM-2, and the first sticks ST1 may be coupled to the coupling grooves CGV, respectively. The first sticks ST1 may be coupled to the coupling grooves CGV of the frame FM through a welding process.

The first sticks ST1 may be coupled to the frame FM to overlap the first opening OP-F. The first sticks ST1 may extend in the first direction DR1 and may be arranged in the second direction DR2. The first sticks ST1 may be formed of or include SUS(Steel Use Stainless). Each of the first sticks ST1 may include an outer region OA, which is coupled to the coupling grooves CGV, and an inner region IA, which overlaps the first opening OP-F. Each of the first sticks ST1 is illustrated to have two outer regions OA.

FIG. 3 illustrates an example of the mask assembly MSA that has five first sticks ST1-1, ST1-2, ST1-3, ST1-4, and ST1-5. Two outermost sticks ST1-1, ST1-5 of the first sticks ST1 will be referred to as outermost sticks ST1-1, ST1-5, and the remaining sticks ST1-2, ST1-3, ST1-4 of the first sticks ST1 disposed between the outermost two sticks ST1-1, ST1-5 will be referred to as inner sticks ST1-2, ST1-3, ST1-4.

Each of the first sticks ST1 may have a first edge ED1 and a second edge ED2 facing each other in the second direction DR2. The first and second edges ED1 and ED2 may be provided to allow each of the inner sticks ST1-2, ST1-3, and ST1-4 to have a symmetric shape about the first direction axis DR1. The inner sticks ST1-2 to ST1-4 may have the same shape as each other.

In the present embodiment, each of the outermost sticks ST1-1 and ST1-5 may have a shape different from the inner sticks ST1-2, ST-3, ST1-4. In each of the outermost sticks ST1-1 and ST1-5, a shape of the first edge ED1 may be different from a shape of the second edge ED2, when viewed in a plan view. The shape of the first sticks ST1 will be described in more detail with reference to FIGS. 5A, 5B, and 5C.

The masks MSK may be disposed on the frame FM and the first sticks ST1 to extend in the second direction DR2 and may be arranged in the first direction DR1. The masks MSK may include, for example, an invar alloy having a small thermal expansion coefficient. The masks MSK may be formed of or include at least one of, for example, nickel (Ni), nickel-cobalt alloys, or nickel-iron alloys.

A plurality of openings OP-M (hereinafter, second openings OP-M) may be defined in each of the masks MSK. Each of the masks MSK may include an opening region A-OP, in which the second openings OP-M are defined, and a non-opening region A-NOP, which is provided to enclose the opening region A-OP. Each of the masks MSK may have a single opening region A-OP, which is continuously extended in the second direction DR2. The second openings OP-M may be uniformly arranged in the opening region A-OP.

The opening region A-OP may be defined to have a length that is between 0.85 and 0.95 times a length of the mask MSK. The length of the opening region A-OP may be measured as the shortest distance, in the second direction DR2, between a pair of the openings OP-M that are respectively located closest to two opposite ends of the mask MSK. A portion of the opening region A-OP (e.g., some of the second openings OP-M) may overlap the first sticks ST1.

The masks MSK may be welded to the frame FM. Although not shown in FIG. 2, each of the masks MSK may be stretched or pulled in the second direction DR2, before welding the masks MSK to the frame FM. The mask assembly MSA may include a plurality of the masks MSK, instead of a large-size mask corresponding to the frame FM, and this may make it possible to suppress a drooping issue of the mask.

As shown in FIG. 4, in each of the opening regions A-OP, an inner region, which is delimited by, or located between, two adjacent ones of the first sticks ST1-1 to ST1-5, may be referred to as a unit cell opening region A-OPU. In an embodiment, the mask assembly MSA may include a plurality of the unit cell opening regions A-OPU. The unit cell opening regions A-OPU may correspond to respective ones of unit cell regions US of the working substrate WS, which will be described with reference to FIG. 6, and are formed respective ones of display regions DP-DA of the unit cell regions US.

The mask assembly MSA shown in FIGS. 2, 3, and 4 may be used in a deposition process to be performed on the working substrate WS (e.g., see FIGS. 6 and 7), when there is a need to form a non-typical shape of the display region DP-DA on the working substrate WS. Here, the non-typical shape means a shape that is substantially different from a rectangular shape whose corner angle is substantially or approximately 90°, when viewed in a plan view. For example, the display region DP-DA of the non-typical shape may include at least one curved edge, a concave region, or a convex region.

Figure 5A:
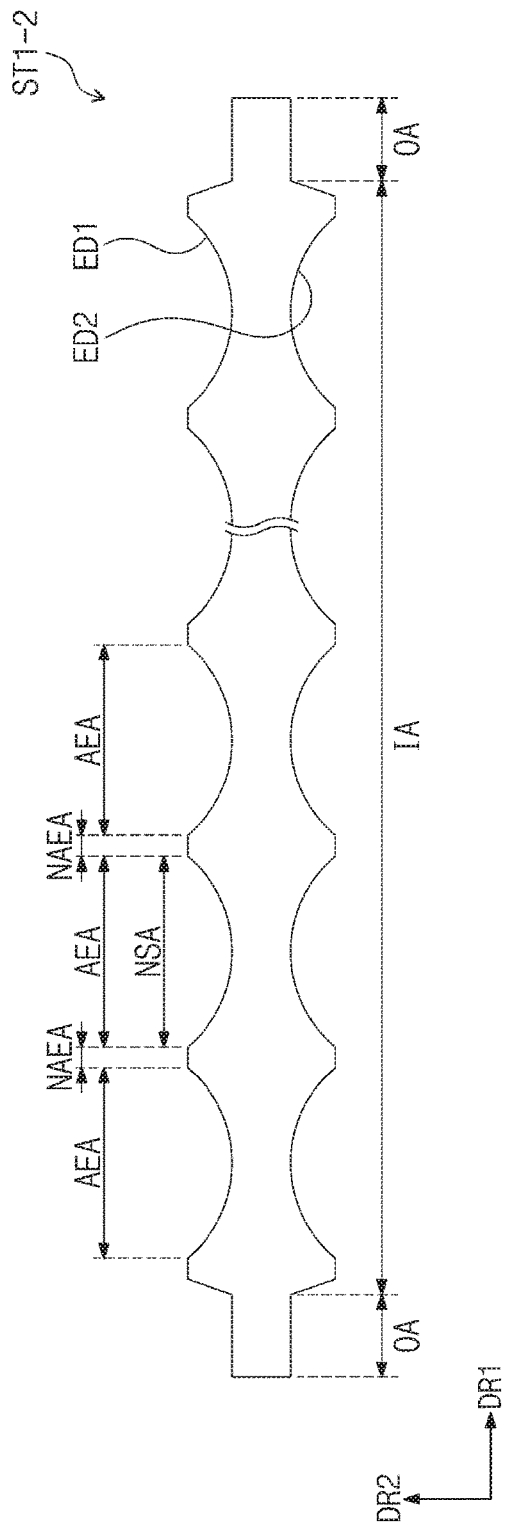
FIG. 5A is a plan view illustrating an inner stick according to an embodiment of the inventive concept.
Figure 5B:
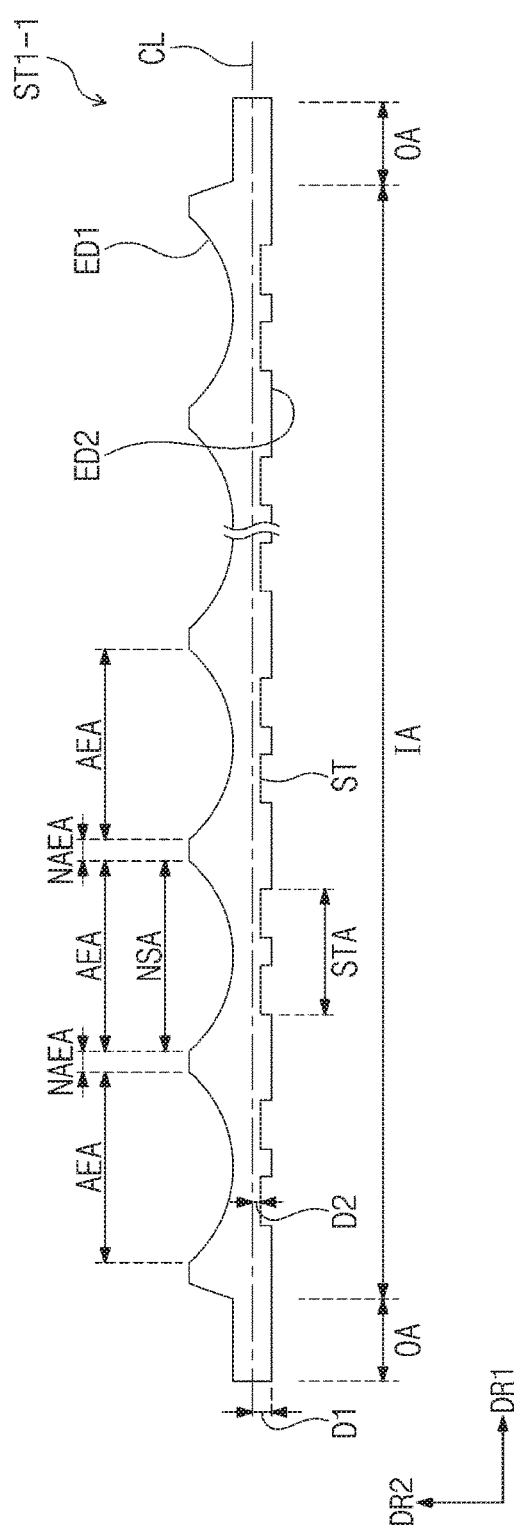

Hereinafter, the unit cell opening region A-OPU will be described in more detail with reference to FIG. 4 and FIGS. 5A, 5B, and 5C. FIG. 5A is a plan view illustrating the inner stick ST1-2 according to an embodiment of the inventive concept. Although inner stick ST1-2 is illustrated and discussed below, the discussion is equally applicable to the other inner sticks ST1-3, ST1-4. FIGS. 5B and 5C are plan views each illustrating the outermost sticks ST1-1 and ST1-5, respectively, according to an embodiment of the inventive concept.

To allow the display region DP-DA to have a non-typical shape (e.g., see FIGS. 6 and 7), the unit cell opening regions A-OPU of FIG. 4 may also have a non-typical shape. To form the unit cell opening regions A-OPU with the non-typical shape, at least one of the first and second edges ED1 and ED2 of the first sticks ST1-1, ST1-2, and ST1-5 may include a non-straight region NSA, as shown in FIGS. 5A, 5B, and 5C. In other words, the first sticks ST1-1, ST1-2, and ST1-5 may have a non-uniform width, and here, the width means the shortest length of each of the first sticks ST1-1, ST1-2, and ST1-5 measured in the first direction DR1.

As shown in FIGS. 5A, 5B, and 5C, each of the first and second edges ED1 and ED2 of the first sticks ST1-1, ST1-2, and ST1-5 may include an active edge region AEA and an inactive edge region NAEA. In an embodiment, a plurality of the active edge regions AEA and a plurality of the inactive edge regions NAEA may be provided.

The active edge region AEA of FIGS. 5A, 5B, and 5C may be a region that overlaps the opening region A-OP of FIG. 4, and the inactive edge region NAEA of FIGS. 5A, 5B, and 5C may be a region that overlaps the non-opening region A-NOP of FIG. 4. The active edge region AEA of at least one of the first and second edges ED1 and ED2 may include a non-straight (e.g., curved) region.

As shown in FIG. 4, the unit cell opening region A-OPU, which is defined by each of the outermost sticks ST1-1 and ST1-5, may have the same shape as the unit cell opening region A-OPU, which is defined by the inner stick ST1-2. To prevent the outermost sticks ST1-1 and ST1-5 from influencing the frame FM or to prevent the outermost sticks ST1-1 and ST1-5 from overlapping the third and fourth extended portions FM-3 and FM-4 of the frame FM, the outermost sticks ST1-1 and ST1-5 may have an asymmetric shape with respect to the first direction axis DR1, as shown in FIGS. 5B and 5C.

The first outermost stick ST1-1, i.e., 1-st stick ST1-1, and the second outermost stick ST1-5, i.e., 5-th stick ST1-5, may have an asymmetric shape with respect to the first direction axis DR1. Thus, the unit cell opening region A-OPU, which is defined by the 1-st stick ST1-1 and a 2-nd stick ST1-2 of the first sticks ST1-1 to ST1-5, may have the same shape as that of the unit cell opening region A-OPU, which is defined by the 4-th stick ST1-4 and the 5-th stick ST1-5 of the first sticks ST1-1 to ST1-5.

Since, as shown in FIG. 5A, the first and second edges ED1 and ED2 of the inner stick ST1-2 have a symmetric shape with respect to the first direction axis DR1, it may be possible to suppress deformation of the inner stick ST1-2, which may occur when external heat is supplied to the inner stick ST1-2.

By contrast, since, as shown in FIGS. 5B and 5C, the first and second edges ED1 and ED2 of the outermost sticks ST1-1 and ST1-5 have an asymmetric shape with respect to the first direction axis DR1, deformation of the outermost sticks ST1-1 and ST1-5 may occur when external heat is supplied to the outermost sticks ST1-1 and ST1-5. In the present embodiment, in order to prevent such deformation, the outermost sticks ST1-1 and ST1-5 may be provided to allow the first and second edges ED1 and ED2 to have substantially the same length (hereinafter, referred to as "a reference length"), when the outermost sticks ST1-1 and ST1-5 are in a straight state. In the case where the first and second edges ED1 and ED2 are provided to have substantially the same reference length, it may be possible to minimize a difference in thermal expansion between the first and second edges ED1 and ED2.

To allow the first and second edges ED1 and ED2 of the outermost sticks ST1-1 and ST1-5 to have substantially the same reference length, at least one of the first and second edges ED1 and ED2 may include a plurality of slit regions STA. At least one slit ST may be defined in each of the slit regions STA.

In the case where, as shown in FIG. 5B, a center line CL is assumed to be located at a center of each of the outermost sticks ST1-1 and ST1-5 in the second direction DR2, a length (a distance D2) from the center line CL to the corresponding edge ED2 in a slit ST of the slit region STA may be shorter than a length (a distance D1) from the center line CL to the corresponding edge ED2 in the outer region OA of the outermost sticks ST1-1 and ST1-5. In FIG. 5B, the first distance D1 and the second distance D2 are compared with each other. Since the at least one slit ST is defined, the reference length of the second edge ED2 may be increased.

The afore-described expression "substantially the same reference length" may mean that a difference in thermal expansion between the first and second edges ED1 and ED2 is within an error range capable of preventing a deposited thin-film pattern from having a defect. This may depend on the resolution of the display panel and/or the resolution of the mask MSK, as will described below (e.g., with reference to a fabricating method).

Figure 6:
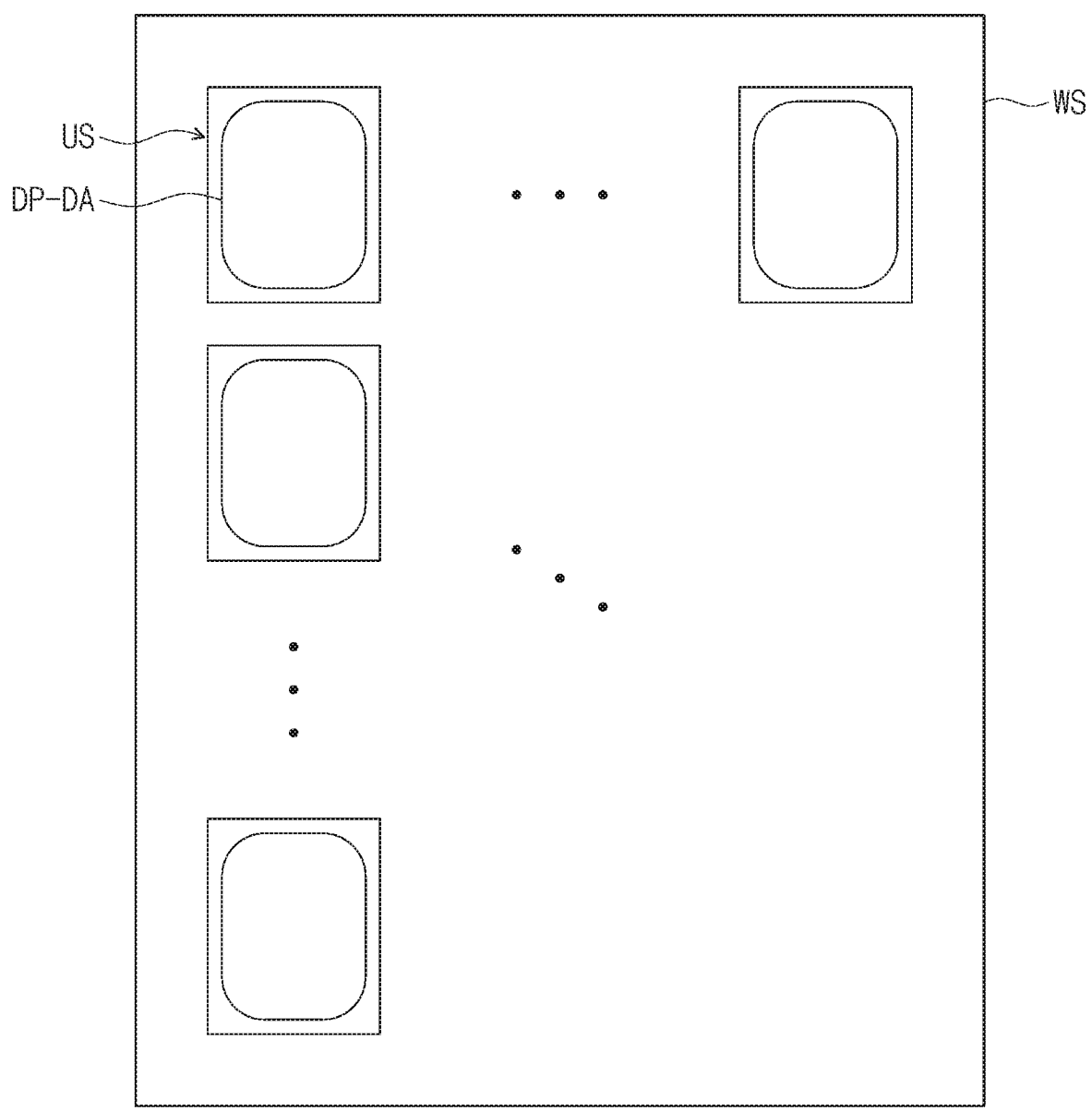
FIG. 6 is a plan view illustrating a working substrate according to an embodiment of the inventive concept.
Figure 7:
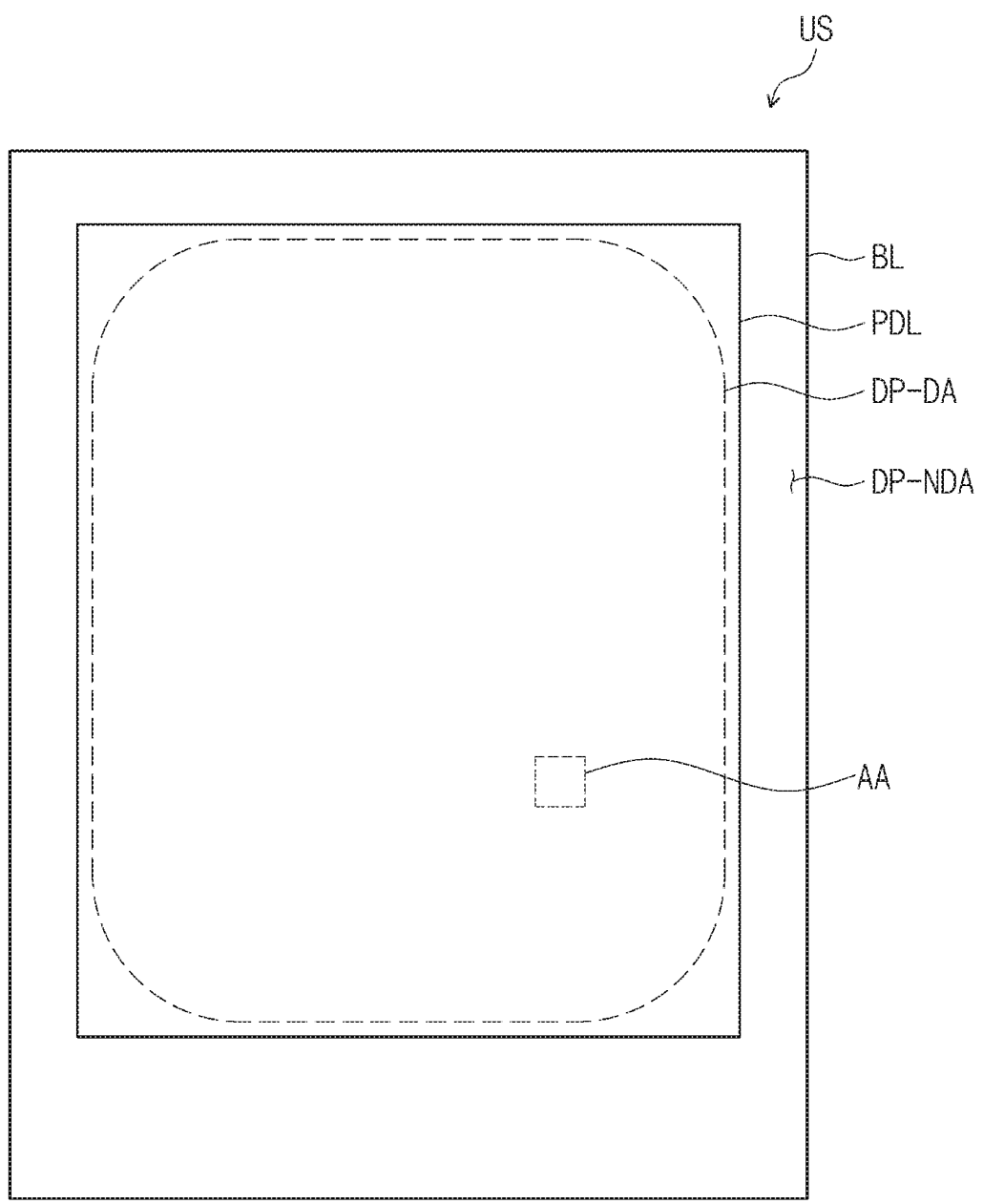
FIG. 7 is a plan view illustrating one of unit cell regions shown in FIG. 6.
Figure 8:
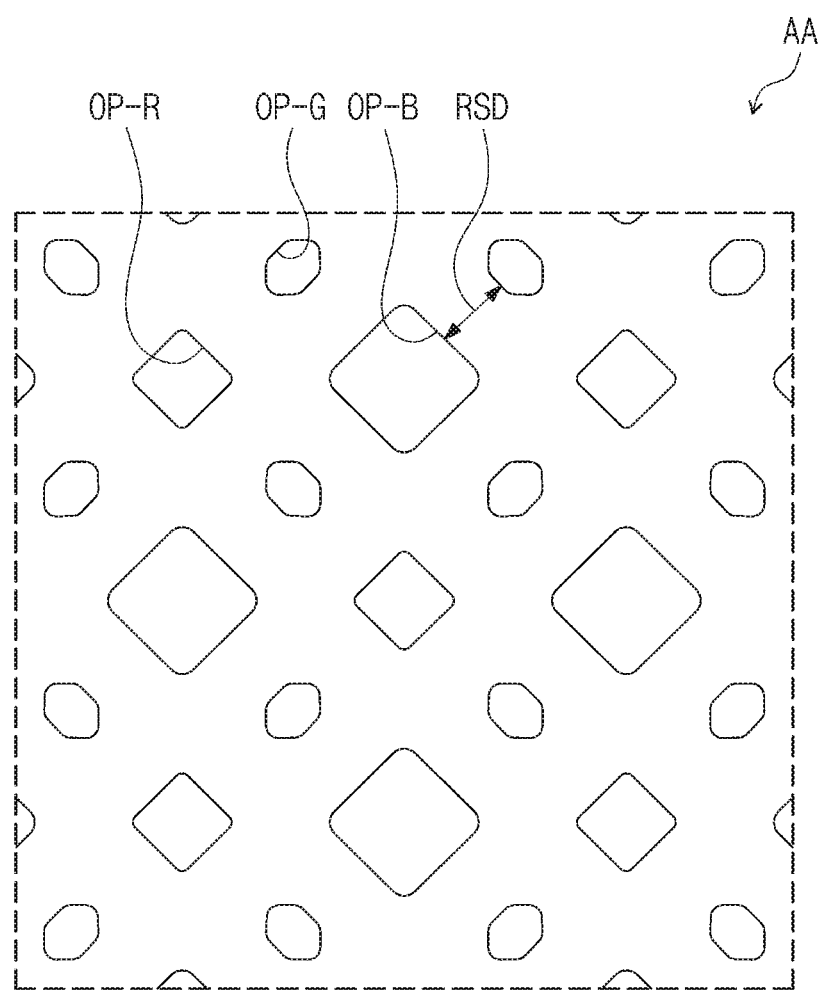
FIG. 8 is an enlarged plan view illustrating a portion 'AA' of FIG. 7.
Figure 9A:
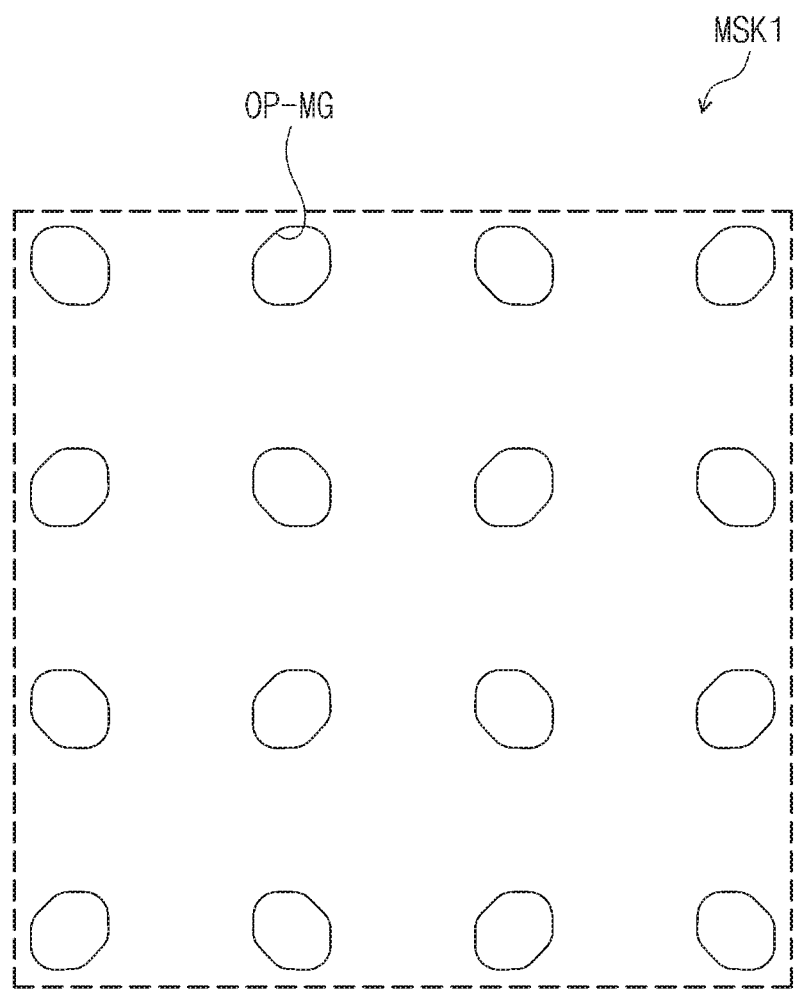
FIG. 9A is an enlarged plan view illustrating a first mask according to an embodiment of the inventive concept.
Figure 9B:
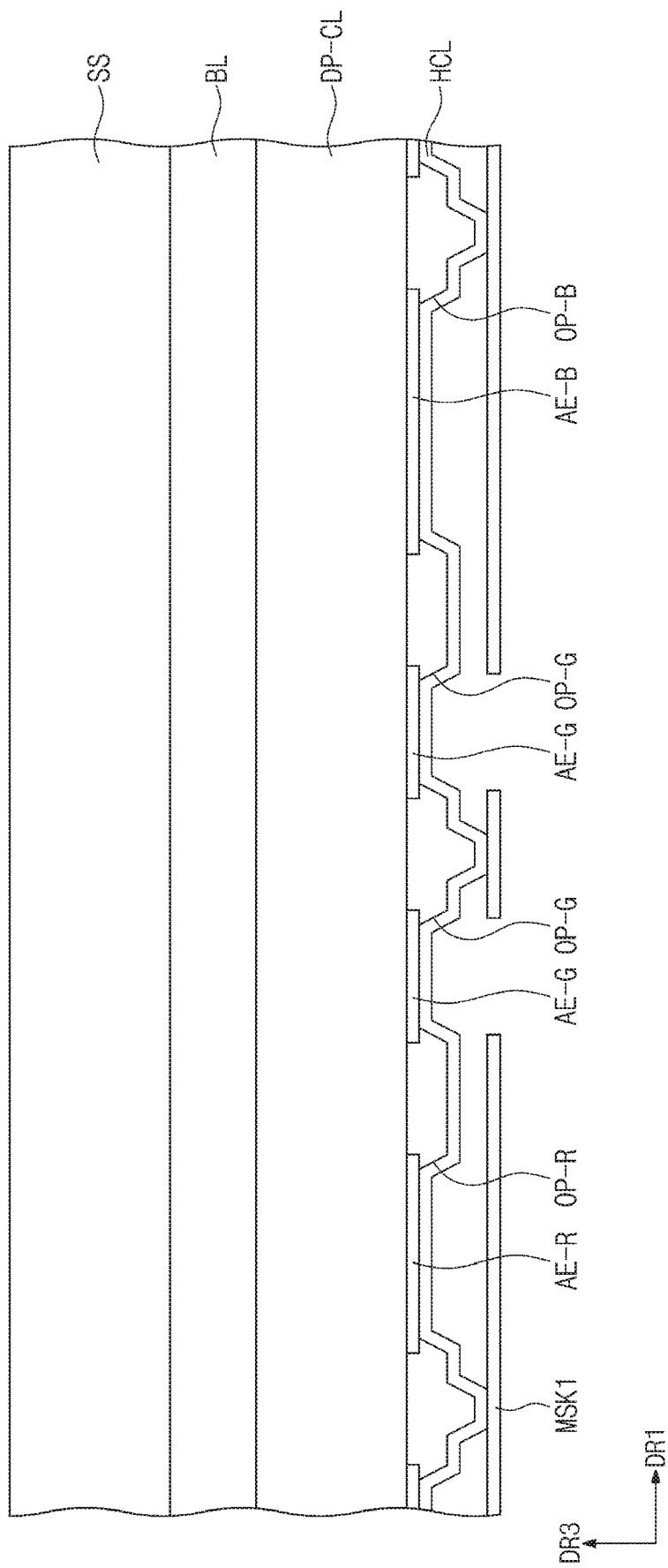
FIG. 9B is a sectional view illustrating a relationship in position between the first mask of FIG. 9A and a unit cell region.
Figure 9C:
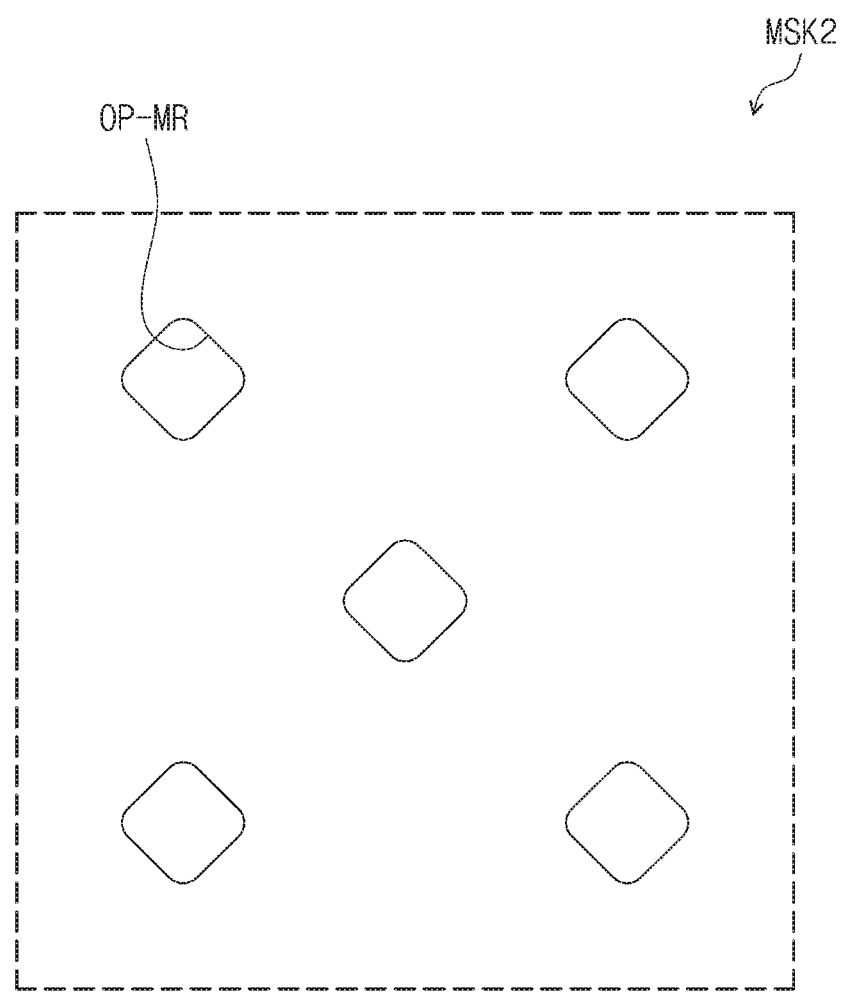
FIGS. 9C and 9D are enlarged plan views illustrating a second mask and a third mask according to an embodiment of the inventive concept.
Figure 9D:
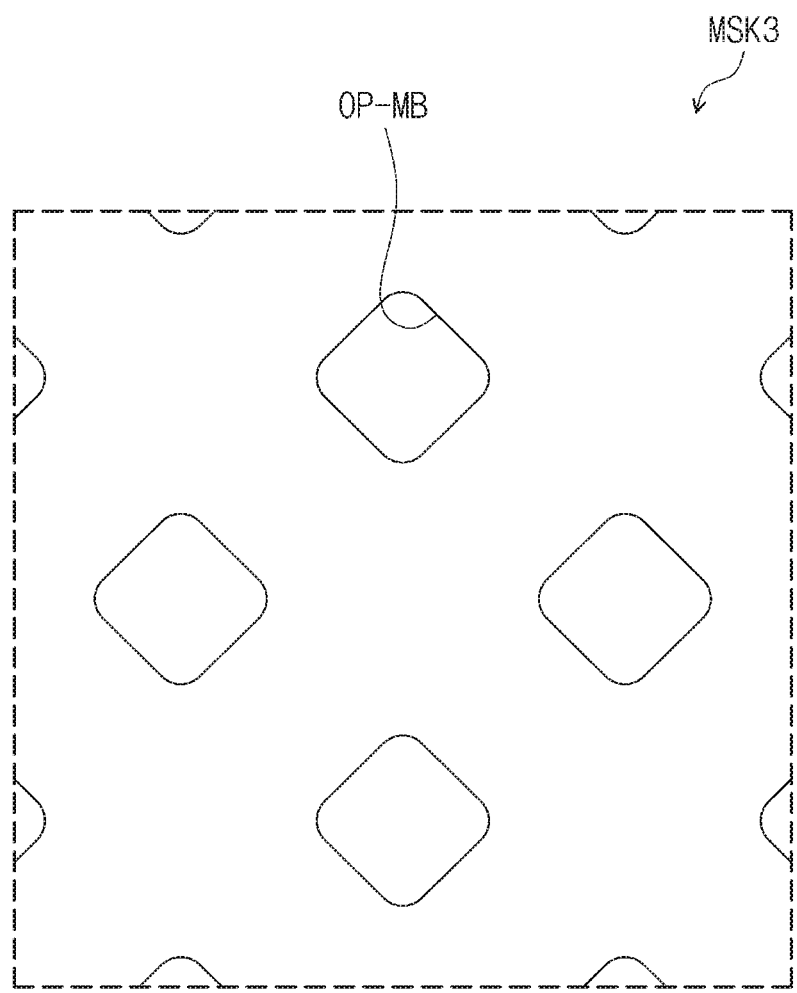

FIG. 6 is a plan view illustrating the working substrate WS according to an embodiment of the inventive concept. FIG. 7 is a plan view illustrating one of the unit cell regions US shown in FIG. 6. FIG. 8 is an enlarged plan view illustrating a portion 'AA' of FIG. 7. FIG. 9A is an enlarged plan view illustrating a first mask MSK1 according to an embodiment of the inventive concept. FIG. 9B is a sectional view illustrating a relationship in position between the first mask MSK1 of FIG. 9A and the unit cell region US. FIGS. 9C and 9D are enlarged plan views illustrating a second mask MSK2 and a third mask MSK3 according to an embodiment of the inventive concept.

The working substrate WS of FIG. 6 may include a plurality of the unit cell regions US. If a substrate-level fabrication process on the working substrate WS is finished, the working substrate WS may be divided into the unit cell regions US, each of which will be used as the display panel DP of FIG. 1.

FIGS. 6, 7, and 8 show the working substrate WS that is in a state where a process of forming thin-film patterns using the mask assembly MSA described with reference to FIGS. 2 to 5C is not yet performed. FIG. 9b illustrates the working substrate WS, on which the hole control layer HCL is formed.

FIG. 7 illustrates an example of the non-typical display region DP-DA with four curved corner regions, not the rectangular shape. The display region DP-DA of FIG. 7 may be formed using the unit cell opening region A-OPU shown in FIG. 4.

The pixel definition layer PDL may be disposed to overlap the entire region of the display region DP-DA. A portion of the pixel definition layer PDL may overlap a non-display region DP-NDA. Although the pixel definition layer PDL is illustrated to have a rectangular shape, the inventive concept is not limited thereto.

As shown in FIG. 8, three types of light-emitting openings may be formed in the pixel definition layer PDL. For example, the light-emitting openings in the pixel definition layer PDL may be classified into a first light-emitting opening OP-G, a second light-emitting opening OP-R, and a third light-emitting opening OP-B, based on their areas. An area of each of the first, second, and third light-emitting openings OP-G, OP-R, and OP-B may be proportional to a light emitting area of a corresponding pixel or to an area of a corresponding first electrode. In the present embodiment, the first, second, and third light-emitting openings OP-G, OP-R, and OP-B may correspond to the luminescent devices of the green, red, and blue pixels, respectively.

First, second, and third masks MSK1, MSK2, and MSK3 of FIGS. 9A, 9C, and 9D may be used to form a light emitting layer of a green luminescent device, a light emitting layer of a red luminescent device, and a light emitting layer of a blue luminescent device in respective regions corresponding to the first, second, and third light-emitting openings OP-G, OP-R, and OP-B.

FIG. 9B illustrates the working substrate WS disposed on the first mask MSK1. Three first electrodes AE-G, AE-R, and AE-B corresponding to the first, second, and third light-emitting openings OP-G, OP-R, and OP-B are additionally illustrated. Furthermore, the supporting substrate SS described above is additionally illustrated in FIG. 9B.

Green light emitting layers may be formed on the hole control layer HCL using the mask assembly MSA (e.g., see FIG. 2) including the first mask MSK1 of FIG. 9A. Thereafter, red light emitting layers may be formed using the mask assembly MSA (e.g., see FIG. 2) including the second mask MSK2 shown in FIG. 9C, and then blue light emitting layers may be formed using the mask assembly MSA (e.g., see FIG. 2) including the third mask MSK3 shown in FIG. 9D. Next, the electron control layer ECL of FIG. 1 and so forth may be further formed.

A second opening OP-MG of the first mask MSK1 shown in FIG. 9A may have an area larger than the first light-emitting opening OP-G. When the mask assembly MSA is placed in the deposition chamber CB and the first mask MSK1 and the working substrate WS are aligned to each other, the first light-emitting opening OP-G may be disposed within the second opening OP-MG of the first mask MSK1. When the second mask MSK2 shown in FIG. 9C and the working substrate WS are aligned to each other, the second light-emitting opening OP-R may be disposed within a second opening OP-MR of the second mask MSK2. When the third mask MSK3 shown in FIG. 9D and the working substrate WS are aligned to each other, the third light-emitting opening OP-B may be disposed within a second opening OP-MB of the third mask MSK3.

During a deposition process, the mask assembly MSA may be heated by thermal energy supplied for the deposition process. For example, when a vaporized deposition material is deposited on the mask assembly MSA, the thermal energy may be supplied to the mask assembly MSA. Thus, in the case where the deposition process is repeated, the mask assembly MSA may be deformed by the thermal energy supplied thereto. Such thermal deformation may be likely to occur in the outermost sticks ST1-1 and ST1-5 described with reference to FIGS. 5A to 5C. Since the first edge ED1 and the second edge ED2 of the outermost sticks ST1-1 and ST1-5 have an asymmetrical shape with respect to the first direction axis DR1, the thermal expansion lengths of the first edge ED1 and the second edges ED2 are different from each other. The different thermal expansion lengths of the first edge ED1 and the second edge ED2 cause deformation of the outermost sticks ST1-1 and ST1-5. The deformation of the outermost sticks ST1-1 and ST1-5 may lead to misalignment between the first light-emitting opening OP-G and the second opening OP-MG of the first mask MSK1. This misalignment may result in a process failure such as a non-overlap issue between the deposited thin-film pattern and the first light-emitting opening OP-G.

As described with reference to FIGS. 5A, 5B, and 5C, to prevent the deformation of the outermost sticks ST1-1 and ST1-5, the first and second edges ED1 and ED2 may be provided to have substantially the same reference length. The reference length may be associated with the resolution of the display panel and/or the resolution of the mask MSK, and in this light, an allowable range for "substantially the same reference length" will be described below.

Table 1 shows the numbers of pixels in some resolutions. The minimum distance RSD between the first, second, and third light-emitting openings OP-G, OP-R, and OP-B shown in FIG. 8 may be determined depending on the resolution of a display panel.

TABLE 1

| FHD | 1920 × 1080 |
|---|---|
| QHD | 2560 × 1440 |
| UHD | 7680 × 4320 |

In the case where the shortest or minimum distance (hereinafter, a reference shortest distance RSD) between the first, second, and third light-emitting openings OP-G, OP-R, and OP-B is shorter than 15 μm (i.e., UHD), the first and second edges ED1 and ED2 of substantially the same reference length may mean that a difference in length between them is less than 4.6%. In the case where the reference shortest distance RSD is shorter than 20 μm (i.e., QHD), the first and second edges ED1 and ED2 of substantially the same reference length may mean a difference in length between them is less than 9.6%. In the case where the reference shortest distance RSD is shorter than 25 μm (i.e., FHD), the first and second edges ED1 and ED2 of substantially the same reference length may mean that a difference in length between them is less than 13.5%.

Figure 10A:
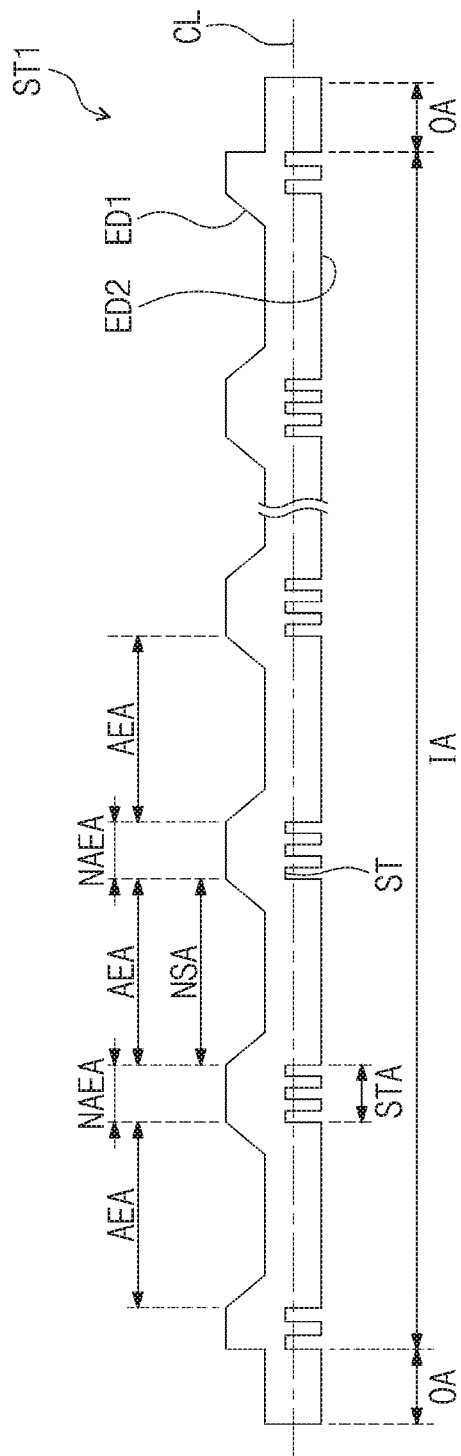
FIG. 10A is a plan view illustrating a first stick according to an embodiment of the inventive concept.
Figure 10B:
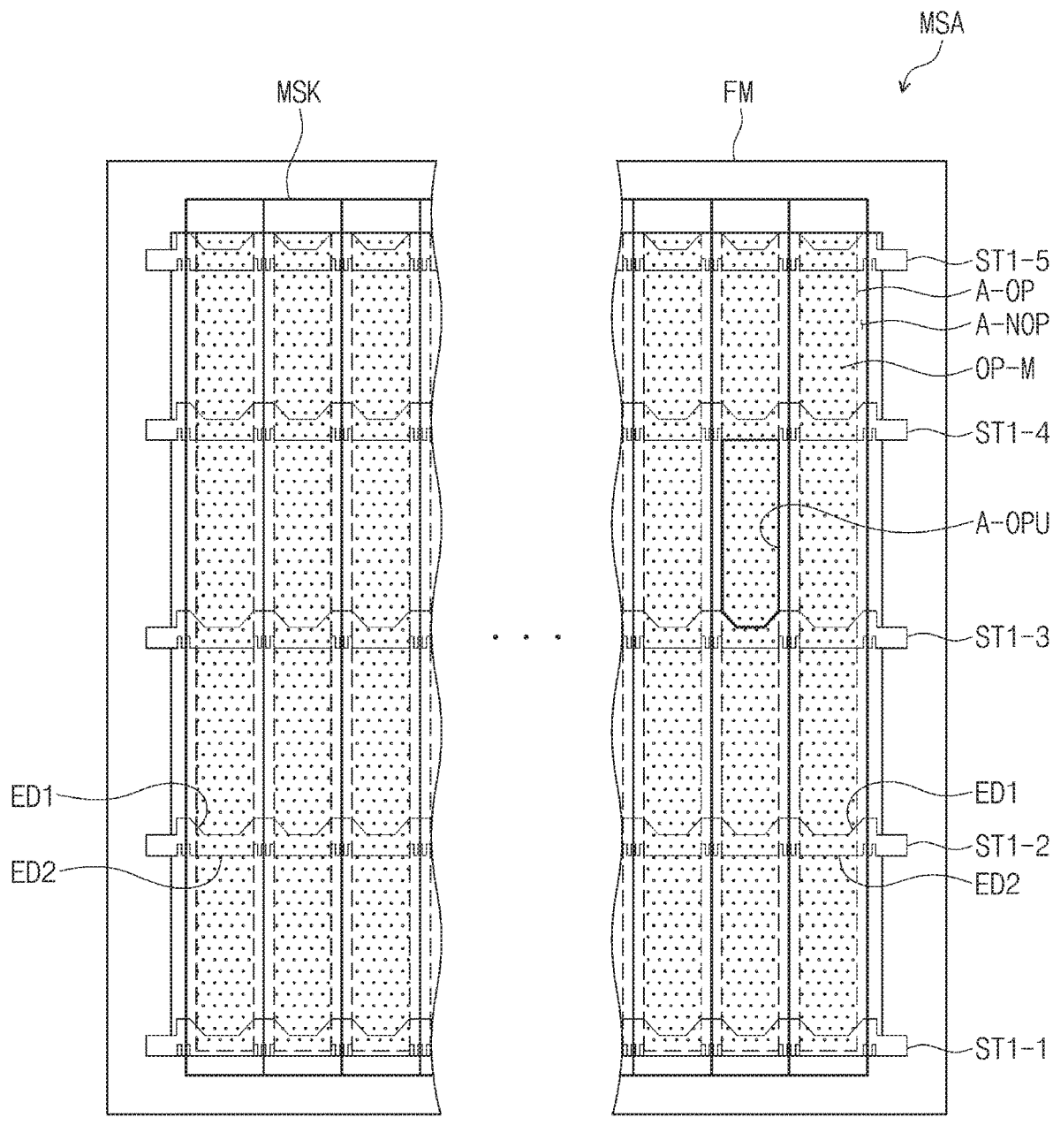
FIG. 10B is a plan view illustrating a mask assembly according to an embodiment of the inventive concept.
Figure 10C:
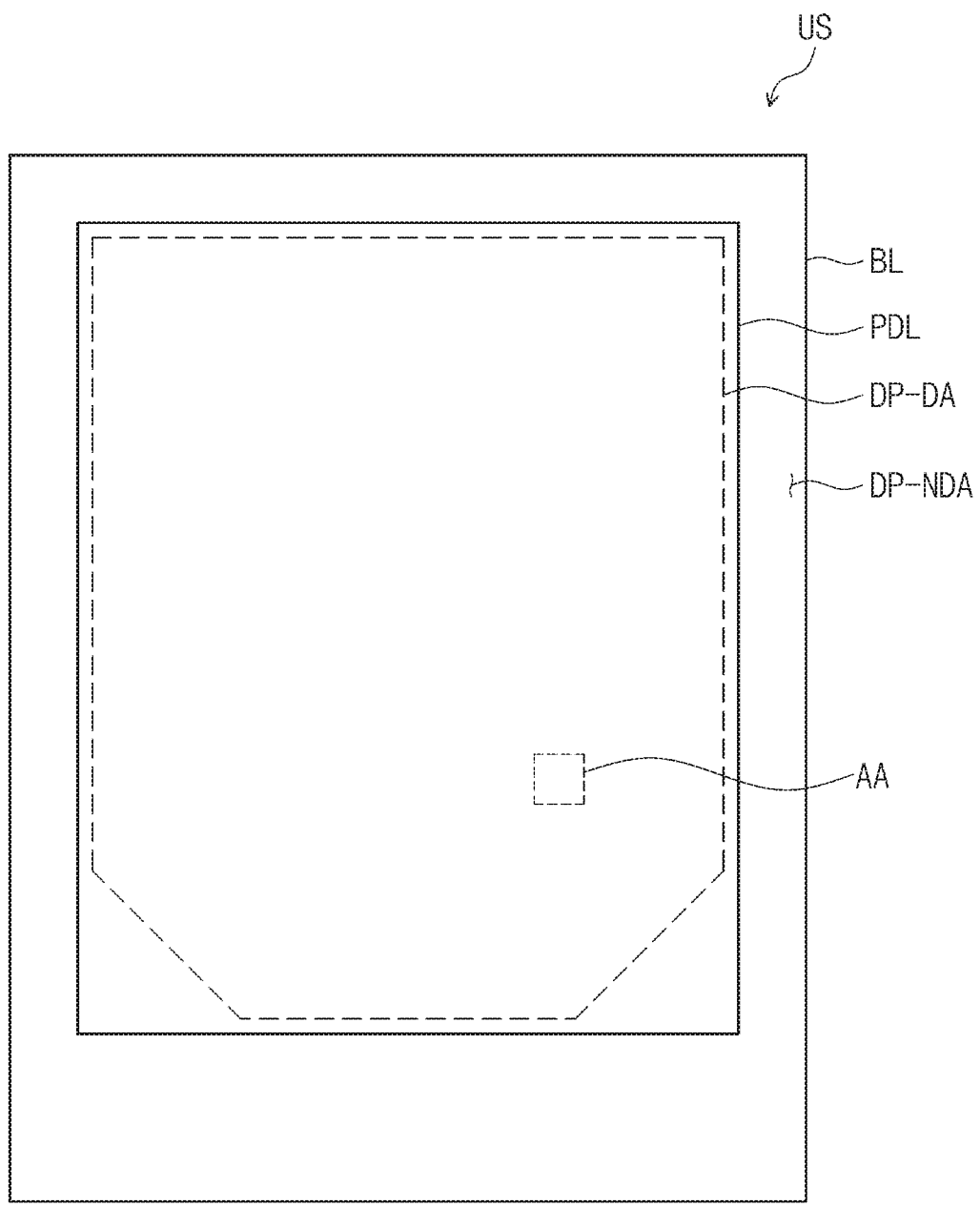
FIG. 10C is a plan view illustrating a unit cell region fabricated using the mask assembly of FIG. 10B.
Figure 11A:
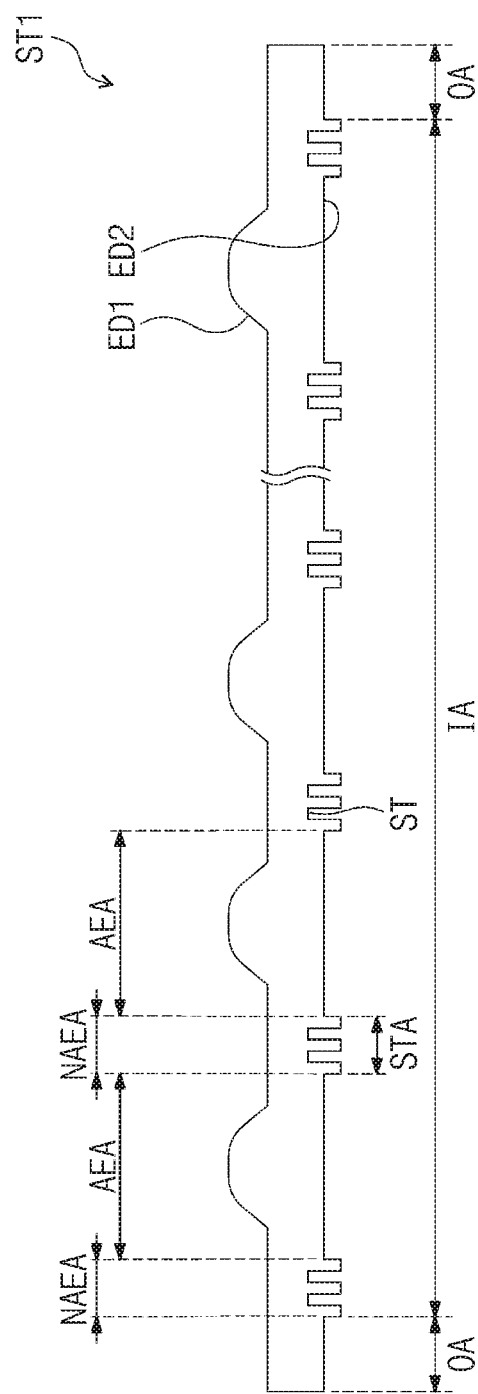
FIG. 11A is a plan view illustrating a first stick according to an embodiment of the inventive concept.
Figure 11B:
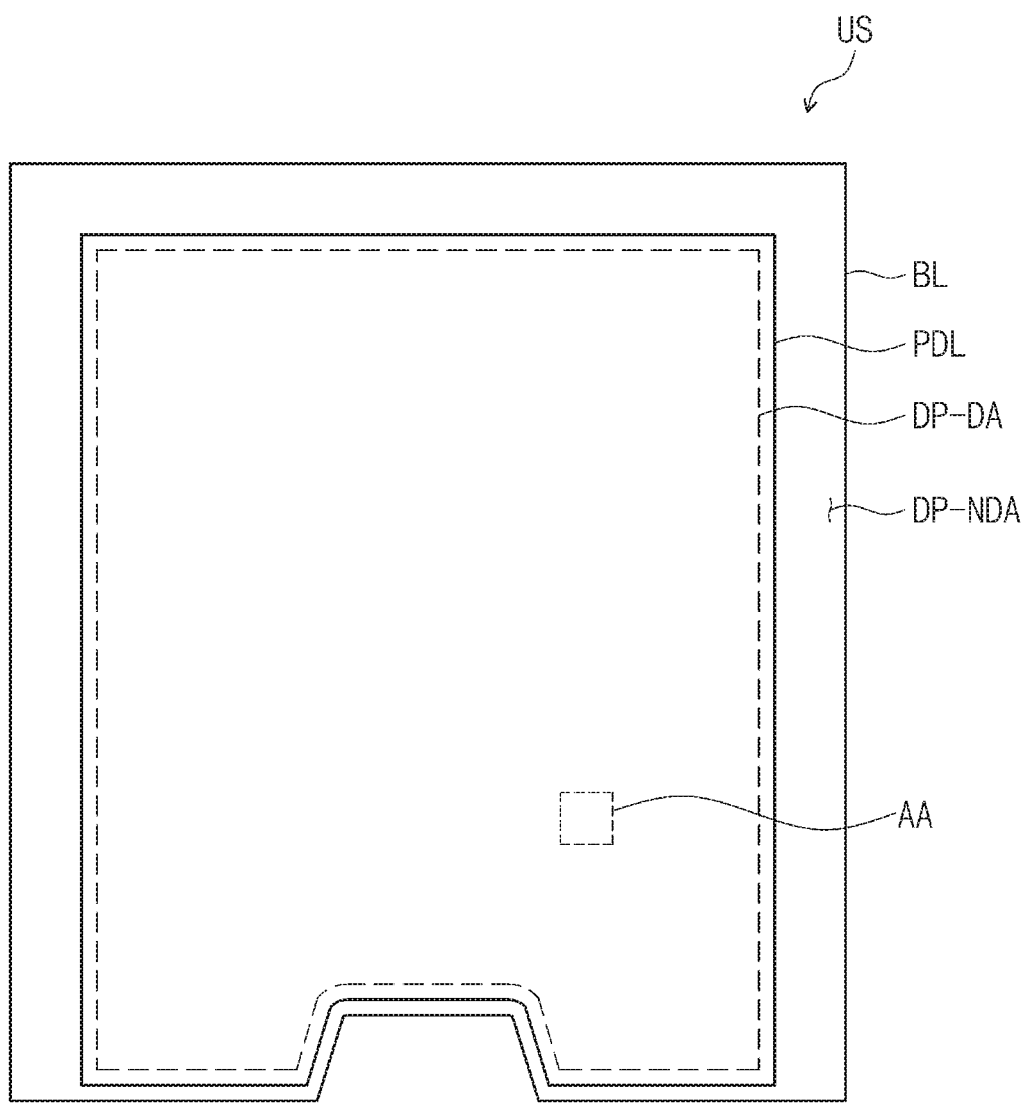
FIG. 11B is a plan view illustrating a unit cell region, which is fabricated using a mask assembly including the first stick of FIG. 11A.

FIG. 10A is a plan view illustrating the first stick ST1 according to an embodiment of the inventive concept. FIG. 10B is a plan view illustrating the mask assembly MSA according to an embodiment of the inventive concept. FIG. 10C is a plan view illustrating the unit cell region US fabricated using the mask assembly MSA of FIG. 10B. FIG. 11A is a plan view illustrating the first stick ST1 according to an embodiment of the inventive concept. FIG. 11B is a plan view of the unit cell region US, which is fabricated using a mask assembly including the first stick ST1 of FIG. 11A. For concise description, an element previously described with reference to FIGS. 1 to 9C may be identified by the same reference number without repeating an overlapping description thereof.

As shown in FIG. 10A, the first and second edges ED1 and ED2 of the first stick ST1 may have an asymmetric shape with respect to the first direction axis DR1. The reference lengths of the first and second edges ED1 and ED2 may be substantially equal to each other.

In an embodiment, the slit region STA may be disposed in the inactive edge region NAEA, and this may make it possible to prevent or suppress the unit cell opening region A-OPU from being deformed by the slit region STA. This will be described with reference to FIG. 10B.

As shown in FIG. 10B, the first sticks ST1-1 to ST1-5 may have substantially the same shape as the first stick ST1 shown in FIG. 10A. FIG. 10C illustrates an example of a non-typical (e.g., hexagonal) display region DP-DA, which is formed using the mask assembly MSA according to an embodiment of the inventive concept. Since, as described above, the slit region STA does not affect a shape of the unit cell opening region A-OPU, a region corresponding to the slit region STA may not be formed in the hexagonal display region DP-DA.

FIG. 11A illustrates a first stick ST1, whose shape of the first edge ED1 is different from that of the first edge ED1 of the first outermost stick ST1-1 of FIG. 5B. The active edge region AEA of the first edge ED1 of FIG. 5B may have a concave shape that is recessed toward the second edge ED2, whereas a portion of the first edge ED1 of FIG. 11A may have a convex shape protruding away from the second edge ED2.

In the case where all of the first sticks ST1-1 to ST1-5 of the mask assembly MSA (e.g., see FIG. 10B) for a deposition process are provided to have the same shape as the first stick ST1 of FIG. 11A, the display region DP-DA may be formed to have a non-typical shape, as shown in FIG. 11B. Although FIG. 11B illustrates one of the unit cell regions US that is obtained by dividing the working substrate WS, the base layer BL and the pixel definition layer PDL may also have such a non-typical shape.

Figure 12A:
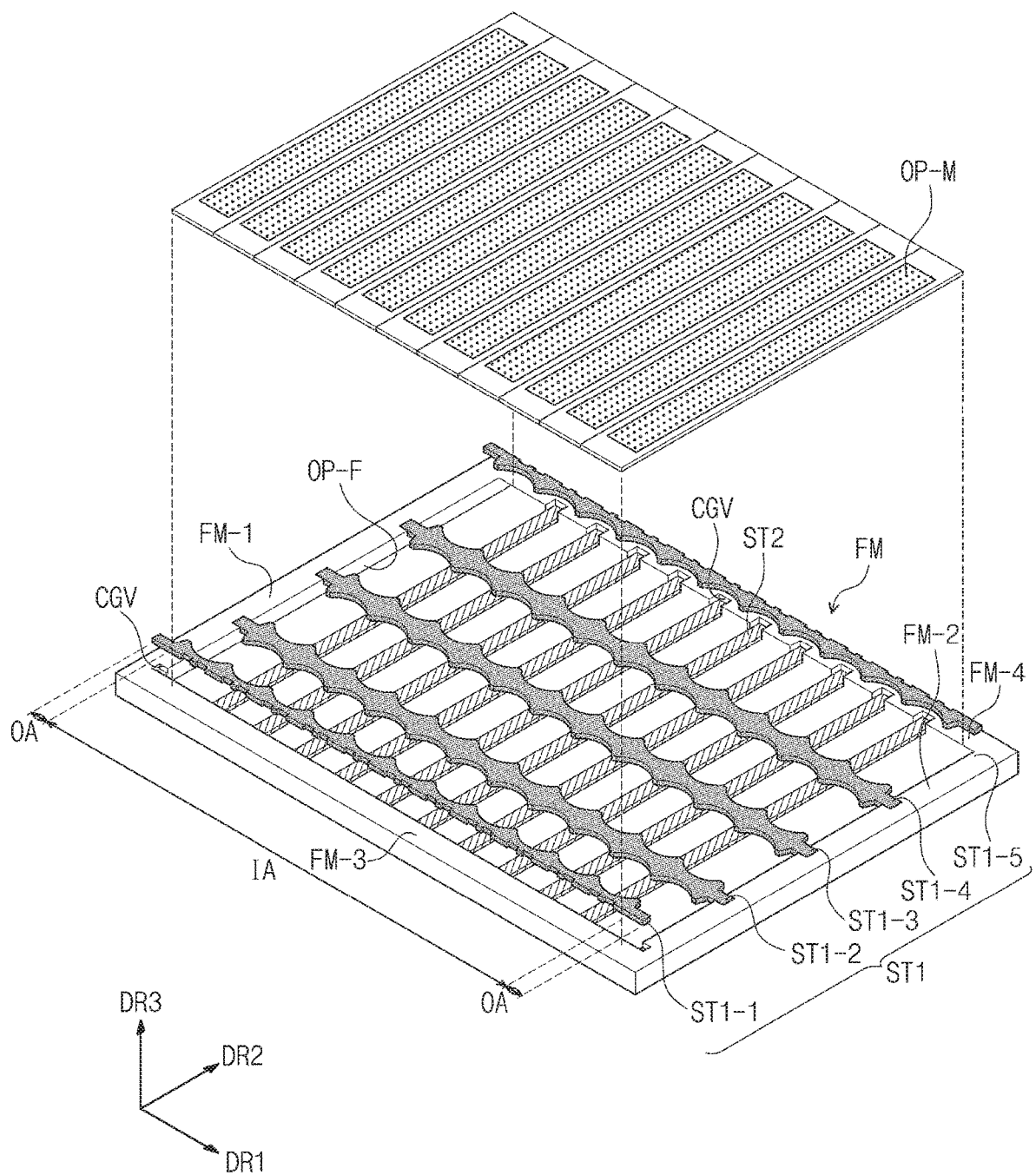
FIG. 12A is a perspective view illustrating a mask assembly according to an embodiment of the inventive concept.
Figure 12B:
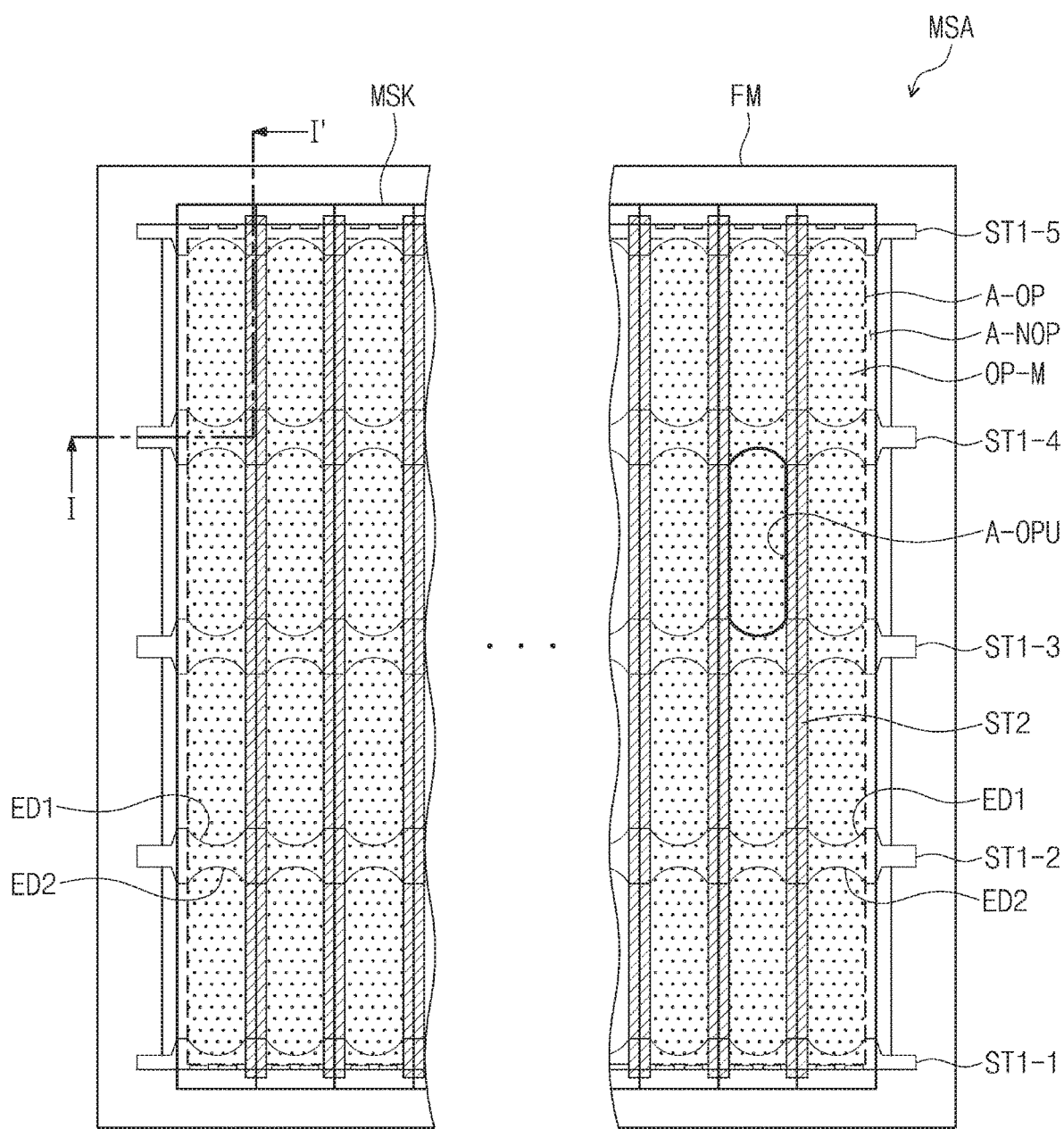
FIG. 12B is a plan view illustrating a mask assembly according to an embodiment of the inventive concept.
Figure 12C:
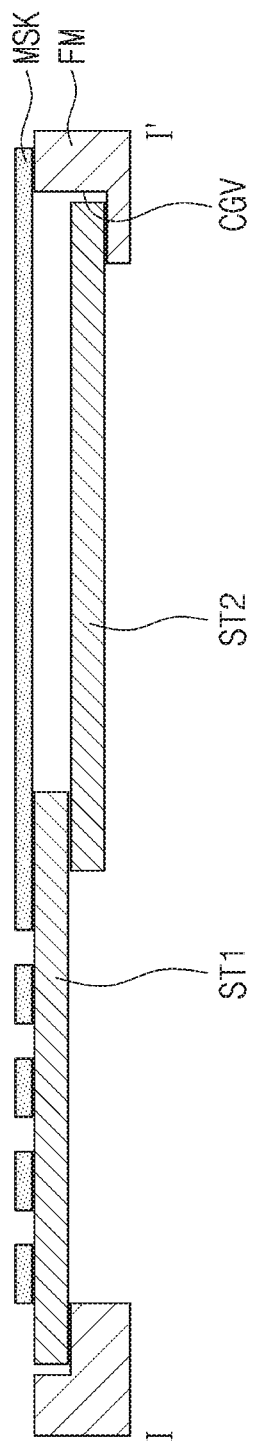
FIG. 12C is a sectional view illustrating a mask assembly according to an embodiment of the inventive concept.

FIG. 12A is a perspective view illustrating the mask assembly MSA according to an embodiment of the inventive concept. FIG. 12B is a plan view illustrating the mask assembly MSA according to an embodiment of the inventive concept. FIG. 12C is a sectional view illustrating the mask assembly MSA according to an embodiment of the inventive concept. For concise description, an element previously described with reference to FIGS. 1 to 11B may be identified by the same reference number without repeating an overlapping description thereof.

As shown in FIGS. 12A and 12B, the mask assembly MSA may further include second sticks ST2. The second sticks ST2 may be coupled to the frame FM to overlap the first opening OP-F. The second sticks ST2 may extend in the second direction DR2 and may be arranged in the first direction DR1. Opposite end portions of each of the second sticks ST2 may be inserted into coupling grooves CGV defined in the third extension portion FM-3 and the fourth extension portion FM-4.

The second sticks ST2 may have a straight line shape whose width in the first direction DR1 is substantially constant. In each of the second sticks ST2, at least a portion overlaps the first opening OP-F may be provided to satisfy the above width condition. In this case, it may be possible to prevent the second sticks ST2 from being deformed by external heat.

As shown in FIG. 12B, the second sticks ST2 may overlap a border between two adjacent masks of the masks MSK. The second sticks ST2 may overlap the non-opening regions A-NOP of two adjacent masks MSK and their edges. The second sticks ST2 may support the first sticks ST1 and to prevent a vaporized deposition material from being deposited on the non-opening regions A-NOP.

Figure 13:
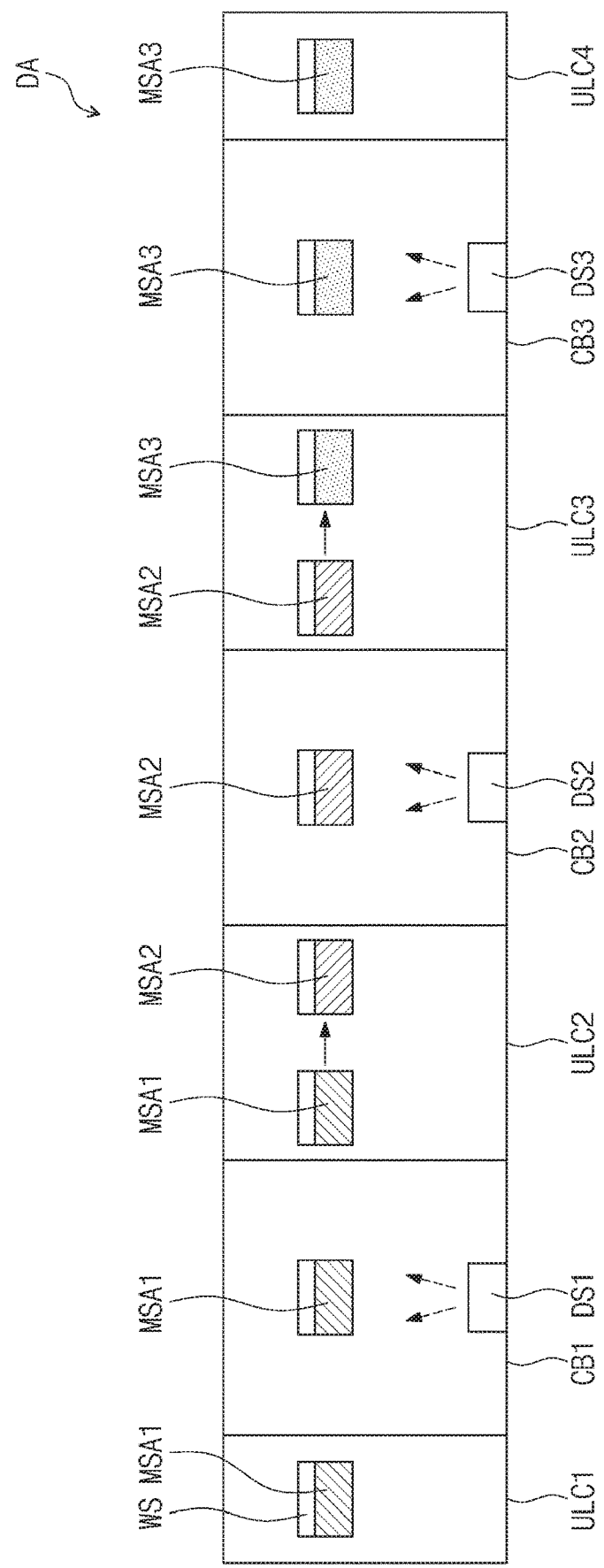
FIG. 13 is a sectional view illustrating a deposition apparatus according to an embodiment of the inventive concept.

FIG. 13 is a sectional view illustrating the deposition apparatus DA according to an embodiment of the inventive concept. The deposition apparatus DA according to the present embodiment may be used as a part of an in-line system. In FIG. 13, a mechanical apparatus (hereinafter, a holding apparatus) for holding the mask assembly MSA, a mechanical apparatus for moving the mask assembly MSA, and a mechanical apparatus for separating the working substrate WS from the mask assembly MSA may not be shown.

The deposition apparatus DA may include first, second, third, and fourth loading/unloading chambers ULC1, ULC2, ULC3, and ULC4 and first, second, and third deposition chambers CB1, CB2, and CB3. Each of the first to third deposition chambers CB1 to CB3 may be substantially the same as the chamber CB of FIG. 2.

Each of mask assemblies MSA1, MSA2, and MSA3 of FIG. 13 may be one of the mask assemblies MSA described above. The types of masks provided in the mask assemblies MSA1 to MSA3 may be determined depending on the types of the first to third deposition chambers CB1 to CB3, in which the mask assemblies MSA1 to MSA3 will be used, respectively.

First, second, and third deposition sources DS1, DS2, and DS3 may be disposed in the first, second, and third deposition chambers CB1, CB2, and CB3, respectively. For example, the first to third deposition sources DS1 to DS3 may provide a green luminescent material, a red luminescent material, and a blue luminescent material, respectively.

In the first loading/unloading chamber ULC1, the working substrate WS may be mounted on the mask assembly MSA1. The mask assembly MSA1, to which the working substrate WS is aligned, may be loaded on a holding apparatus. The mask assembly MSA1 may include the first mask MSK1 shown in FIG. 9A. In the first deposition chamber CB1, thin-film patterns formed of a green luminescent material may be formed on the working substrate WS.

In the second loading/unloading chamber ULC2, the mask assembly MSA1 including the first mask MSK1 may be unloaded from the holding apparatus, and then, the mask assembly MSA2 including the second mask MSK2 of FIG. 9C may be loaded on a holding apparatus. In the second deposition chamber CB2, thin-film patterns formed of a red luminescent material may be formed on the working substrate WS.

In the third loading/unloading chamber ULC3, the mask assembly MSA2 including the second mask MSK2 may be unloaded from the holding apparatus, and then, the mask assembly MSA3 including the third mask MSK3 of FIG. 9D may be loaded on a holding apparatus. In the third deposition chamber CB3, thin-film patterns formed of a blue luminescent material may be formed on the working substrate WS.

In the fourth loading/unloading chamber ULC4, the mask assembly MSA3 including the third mask MSK3 may be unloaded from the holding apparatus. A step for a subsequent process may be further performed in the fourth loading/unloading chamber ULC4.

According to the afore-described embodiments of the inventive concept, two opposite edges (e.g., first and second edges) of at least an outermost stick extending in a length direction have shapes that are asymmetric with respect to a direction axis indicating the length direction. When the first and second edges are in a straight state, the first and second edges may have substantially the same linear length, and this may make it possible to prevent the outermost stick from being deformed by an external heat.

Second sticks may be disposed to protect a vaporized deposition material, which supplies thermal energy to the mask, and thereby to suppress the deformation of the mask.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a display device, comprising:
    placing a working substrate, which is supported by a first mask assembly, in a chamber; and
    depositing a first deposition material from a first deposition source onto the working substrate,
    wherein the first mask assembly comprises:
    a frame having a first length in a first direction and a second length in a second direction crossing the first direction, the first length being longer than the second length, a first opening being defined in the frame;
    a plurality of sticks coupled to the frame to overlap the first opening, the plurality of sticks extending in the first direction and being arranged in the second direction; and
    a plurality of first masks disposed on the frame and the sticks, the plurality of first masks extending in the second direction and being arranged in the first direction, a plurality of second openings being defined in each of the plurality of first masks,
    wherein each of the sticks comprises a first edge and a second edge, which are opposite to each other in the second direction,
    when viewed in a plan view defined by the first and second directions, the first and second edges of an outermost stick of the sticks have different shapes, and
    linear lengths of the first and second edges of the outermost stick are substantially equal to each other, where the linear lengths are lengths of the first and second edges measured in a straight state.

2. The method of claim 1, wherein each of the plurality of first masks comprises an opening region, in which the plurality of second openings are defined, and a non-opening region, which encloses the opening region,
    the working substrate comprises a plurality of unit cell regions, and
    each of the plurality of unit cell regions comprises a display region, which overlaps the opening region, and a non-display region, which is adjacent to the display region and overlaps the non-opening region.

3. The method of claim 2, wherein the opening region comprises a unit cell opening region, which is located between two adjacent sticks of the sticks, and
    the unit cell opening region is aligned to the display region.

4. The method of claim 2, further comprising dividing the working substrate into the plurality of unit cell regions.

5. The method of claim 2, wherein the first deposition material is formed on the display region to serve as a light emitting layer of an organic light emitting diode.

6. The method of claim 1, further comprising,
    separating the working substrate from the first mask assembly;
    mounting the working substrate on a second mask assembly; and
    depositing a second deposition material, which is supplied from a second deposition source and is different from the first deposition material, onto the working substrate, wherein the second mask assembly comprises a plurality of second masks, in which openings are arranged in a different manner from the second openings of the first masks of the first mask assembly.

* * * * *